(12) United States Patent
Wang et al.

(10) Patent No.: US 8,775,985 B2
(45) Date of Patent: *Jul. 8, 2014

(54) COMPUTER-AIDED DESIGN SYSTEM TO AUTOMATE SCAN SYNTHESIS AT REGISTER-TRANSFER LEVEL

(71) Applicant: Syntest Technologies, Inc., Sunnyvale, CA (US)

(72) Inventors: Laung-Terng Wang, Sunnyvale, CA (US); Xiaoqing Wen, Sunnyvale, CA (US)

(73) Assignee: Syntest Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/845,903

(22) Filed: Mar. 18, 2013

(65) Prior Publication Data

US 2013/0305200 A1 Nov. 14, 2013

Related U.S. Application Data

(60) Division of application No. 13/490,721, filed on Jun. 7, 2012, which is a continuation of application No. 13/030,410, filed on Feb. 18, 2011, now Pat. No. 8,219,945, which is a continuation of application No. 11/984,316, filed on Nov. 15, 2007, now Pat. No. 7,904,857, which is a division of application No. 11/111,908, filed on Apr. 22, 2005, now Pat. No. 7,331,032, which is a division of application No. 10/108,238, filed on Mar. 28, 2002, now Pat. No. 6,957,403.

(60) Provisional application No. 60/279,710, filed on Mar. 30, 2001.

(51) Int. Cl.
*G06F 17/50* (2006.01)

(52) U.S. Cl.
CPC .......... *G06F 17/505* (2013.01); *G06F 17/5027* (2013.01)
USPC ........... 716/103; 716/104; 716/106; 716/111; 703/15

(58) Field of Classification Search
CPC .......................... G06F 17/505; G06F 17/5027
USPC ...................... 716/103, 104, 106, 111; 703/15
See application file for complete search history.

(56) References Cited

U.S. PATENT DOCUMENTS 5,253,255 A * 10/1993 Carbine ........................ 714/734
5,513,123 A    4/1996 Day et al.

(Continued)

FOREIGN PATENT DOCUMENTS

JP          11052024 A     2/1999

OTHER PUBLICATIONS

Chang et al., "Functional Scan Chain Testing", Proceedings of Design, Automation and Test in Europe, Feb. 23-26, 1998, pp. 278-283.

Carletta et al., "Testability Analysis and Insertion for RTL Circuits Based on Pseudorandom BIST", 1995 IEEE International Conference on Computer Design: VLSI in Computers and Processors, Oct. 2, 1995, pp. 162-167.

(Continued)

*Primary Examiner* — Phallaka Kik
(74) *Attorney, Agent, or Firm* — Bacon & Thomas, PLLC

(57) ABSTRACT

A method and system to automate scan synthesis at register-transfer level (RTL). The method and system will produce scan HDL code modeled at RTL for an integrated circuit modeled at RTL. The method and system comprise computer-implemented steps of performing RTL testability analysis, clock-domain minimization, scan selection, test point selection, scan repair and test point insertion, scan replacement and scan stitching, scan extraction, interactive scan debug, interactive scan repair, and flush/random test bench generation. In addition, the present invention further comprises a method and system for hierarchical scan synthesis by performing scan synthesis module-by-module and then stitching these scanned modules together at top-level. The present invention further comprises integrating and verifying the scan HDL code with other design-for-test (DFT) HDL code, including boundary-scan and logic BIST (built-in self-test).

2 Claims, 47 Drawing Sheets

(56) References Cited

U.S. PATENT DOCUMENTS

| | | | |
|---|---|---|---|
| 5,615,126 A | 3/1997 | Deeley et al. | |
| 5,696,771 A | 12/1997 | Beausang et al. | |
| 5,748,647 A | 5/1998 | Bhattacharya et al. | |
| 5,828,579 A | 10/1998 | Beausang | |
| 5,903,466 A | 5/1999 | Beausang et al. | |
| 5,949,692 A | 9/1999 | Beausang et al. | |
| 6,106,568 A * | 8/2000 | Beausang et al. | 716/102 |
| 6,141,790 A | 10/2000 | Beausang et al. | |
| 6,256,770 B1 | 7/2001 | Pierce et al. | |
| 6,269,467 B1 | 7/2001 | Chang et al. | |
| 6,292,915 B1 | 9/2001 | Hosokawa et al. | |
| 6,301,688 B1 | 10/2001 | Roy | |
| 6,311,317 B1 | 10/2001 | Khoche et al. | |
| 6,363,520 B1 | 3/2002 | Boubezari et al. | |
| 6,378,123 B1 | 4/2002 | Dupenioup | |
| 6,405,355 B1 * | 6/2002 | Duggirala et al. | 716/122 |
| 6,421,818 B1 | 7/2002 | Dupenioup et al. | |
| 6,434,735 B1 | 8/2002 | Watkins | |
| 6,449,755 B1 | 9/2002 | Beausang et al. | |
| 6,456,961 B1 | 9/2002 | Patil et al. | |
| 6,457,162 B1 | 9/2002 | Stanion | |
| 6,470,475 B2 | 10/2002 | Dubey | |
| 6,539,536 B1 | 3/2003 | Singh et al. | |
| 6,587,981 B1 * | 7/2003 | Muradali et al. | 714/726 |
| 6,625,784 B1 | 9/2003 | Ohta et al. | |
| 6,675,364 B1 | 1/2004 | Basto et al. | |
| 6,725,432 B2 | 4/2004 | Chang et al. | |
| 6,748,352 B1 | 6/2004 | Yuen et al. | |
| 6,836,877 B1 | 12/2004 | Dupenloup | |
| 7,065,481 B2 | 6/2006 | Schubert et al. | |
| 8,219,945 B2 * | 7/2012 | Wang et al. | 716/103 |
| 2002/0152060 A1 | 10/2002 | Tseng | |
| 2002/0166098 A1 | 11/2002 | Chang et al. | |
| 2003/0014729 A1 | 1/2003 | Yokoyama et al. | |
| 2003/0046643 A1 | 3/2003 | Ohta et al. | |
| 2003/0115564 A1 | 6/2003 | Chang et al. | |
| 2007/0198959 A1 | 8/2007 | Schubert et al. | |

OTHER PUBLICATIONS

Subrata, "RTL Based Scan BIST", Proceedings of VHDL International User's Forum, Oct. 19, 1997, pp. 117-121, especially pp. 118-119.

Huang et al., "On RTL Scan Design", Proceedings of International Test Conference, Oct. 30, 2001, pp. 728-737, especially Fig. 2 and p. 773.

Roy et al., "Efficient Test Mode Selection and Insertion for RTL-BIST", Proceedings of International Test Conference, Oct. 3, 2000, pp. 263-272, especially Fig. 1 and pp. 267-268.

Boubezari et al., "Testability Analysis and Test-Point Insertion in RTL VHDL Specifications for Scan-Based BIST", IEEE Transactions on Computer-Aided Design of Integrated Circuits and Systems, Sep. 1999, vol. 18, No. 9, pp. 1327-1340, especially Fig. 1 and pp. 1329-1332.

Cheng, "Partial Scan Designs Without Using a Separate Scan Clock", 13th IEEE VLSI Test Symposium, Apr. 30, 1995, pp. 277-282.

Gebotys et al., "VLSI Design Synthesis with Testability", 25th ACM/IEEE Design Automation Conference, 1988, pp. 16-21.

Li et al., "An Approach to Behavioral Synthesis for Loop-Based BIST", Proceedings of the 1999 IEEE International Symposium on Circuits and Systems, vol. 6, Jul. 1999, pp. VI-374-377.

Roy, RTL Based Scan BIST, Proceedings of VHDL International User's Forum, Oct. 19-22, 1997, pp. 117-121.

Schmid et al., "Advanced Synchronous Scan Test Methodlogy for Multi-Clock Domain ASICs", 17th IEEE Proceedings of VLSI Test Symposium, Apr. 1999, pp. 106-113.

Cox, Henry: Institute of Electrical and Electronics Engineers: "On Synthesizing Circuits with Implicit Testability Constraints", Proceedings of the International Test Conference, Washing, Oct. 2-6, 1994, New York, IEEE (pp. 989-998).

Darringer, John et al; "EDA in IBM: Past, Present and Future," IEEE Transactions on Computer Aided Design of Integrated Circuits and Systems, IEEE Service Center, Piscataway, NJ US, vol. 19, No. 12, Dec. 2000.

* cited by examiner

```
 1         **** CIRCUIT STATISTICS ****
 2
 3     Number of input pins .................... =  4
 4     Number of output pins ................... = 28
 5     Number of bi-directional pins ........... =  4
 6     Number of accessible nets ............... = 68
 7     Number of accessible flip-flops ......... = 16
 8     Number of accessible latches ............ =  4
 9     Number of accessible RegFiles ........... =  0
10     Number of accessible memory elements .... = 20
11     Number of inaccessible flip-flops ....... =  4
12     Number of inaccessible latches .......... =  0
13     Number of inaccessible RegFiles ......... =  0
14     Number of inaccessible memory elements .. =  4
15
16        **** TESTABILITY ANALYSIS SUMMARY ****
17
18     Floating primary input ports ............ =  1
19     Floating primary output ports ........... =  8
20     Floating bi-directional ports ........... =  4
21     Objects with floating inputs ............ =  0
22     Objects with floating outputs ........... =  0
23     Floating nets ........................... =  1
24     Sequential gated set/reset .............. =  1
25     Combinational gated set/reset ........... =  0
26     Generated set/reset ..................... =  0
27     Destructive set/reset ................... =  0
28     Generated clocks ........................ =  0
29     Sequential gated clocks ................. =  0
30     Combinational gated clocks .............. =  1
31     Constant clocks ......................... =  1
32     Connections from clocks to data inputs... =  2
33     Transparent latches ..................... =  0
34     Unfixed bi-directional pins ............. =  0
35     Combinational feedback loops ............ =  1
36     Potential combinational feedback loops .. =  1
37     Pulse generators ........................ =  0
38     Potential bus contentions ............... =  0
39     Crossing clock domains .................. =  8
```

FIG. 3

```
1    %SCAN_SELECTION
2    {
3    // Do not scan the following 2 modules.
4        %DONT_SCAN_MODULE "module_name_1", "module_name_2";
5    // Scan the following 2 modules only.
6        %SCAN_ONLY_MODULE "module_name_3", "module_name_4";
7    // The total number of scan chains is 16.
8        %SCAN_CHAINS 16;
9    // The maximum number of scan cells in each scan chain is 500.
10       %MAX_SCAN_COUNT 500;
11   // All scan chains should be balanced.
12       %SCAN_BALANCE;
13   // Form a feed-forward partial-scan design with a cell-depth of 3.
14       %CELL_DEPTH 3;
15   // Add AND-control points to the nets with index id1.
16       %ADD_AND_CONTROL_POINTS "id1";
17   // Add OR-control points to the nets with index id2.
18       %ADD_OR_CONTROL_POINTS "id2";
19   // Add MUX-control points to the nets with index id3.
20       %ADD_MUX_CONTROL_POINTS "id3";
21   // Add XOR-control points to the nets with index id4.
22       %ADD_XOR_CONTROL_POINTS "id4";
23   // Add observation points to the nets with index id5.
24       %ADD_OBSERVE_POINTS "id5";
25   // Add XOR-observation points to the nets with index id6.
26       %ADD_XOR_OBSERVE_POINTS "id6";
27   // Add scan points to the nets with index id7.
28       %ADD_SCAN_POINTS "id7";
29   }
```

FIG. 7

|     | Original | Modified |
| --- | --- | --- |
| 1 | `input rst, d, x;` | `input rst, d, x;` |
| 2 | `wire s_rst, c_rst;` | `wire s_rst, c_rst;` |
| 3 | `reg z, q1, q2;` | `reg z, q1, q2;` |
| 4 |  |  |
| 5 | `assign s_rst = rst & z;` | `// Added by rtlscan.` |
| 6 | `assign c_rst = rst & x` | `wire scan_s_rst;` |
| 7 | `always @(posedge clk)` | `wire scan_c_rst;` |
| 8 | `  z <= x;` | `// Added by rtlscan to fix sequential gated set/reset.` |
| 9 |  | `assign scan_s_rst = (~SE) & s_rst;` |
| 10 | `// s_rst is sequential gated set/reset.` | `// Added by rtlscan to fix combinational gated set/reset.` |
| 11 | `always @(posedge clk or posedge s_rst)` | `assign scan_c_rst = (~SE) & c_rst;` |
| 12 | `  if (s_rst)` |  |
| 13 | `    q1 <= 0;` | `assign s_rst = rst & z;` |
| 14 | `  else` | `assign c_rst = rst & x` |
| 15 | `    q1 <= d;` | `always @(posedge clk)` |
| 16 |  | `  z <= x;` |
| 17 | `// c_rst is combinational gated set/reset.` |  |
| 18 | `always @ (posedge clk or posedge c_rst)` | `// Modified by rtlscan to fix set/reset.` |
| 19 | `  if (c_rst)` | `always @(posedge clk or posedge scan_s_rst)` |
| 20 | `    q2 <= 0;` | `  if (scan_s_rst)` |
| 21 | `  else` | `    q1 <= 0;` |
| 22 | `    q2 <= d;` | `  else` |
| 23 |  | `    q1 <= d;` |
| 24 |  |  |
| 25 |  | `// Modified by rtlscan to fix set/reset.` |
| 26 |  | `always @(posedge clk or posedge scan_c_rst)` |
| 27 |  | `  if (scan_c_rst)` |
| 28 |  | `    q2 <= 0;` |
| 29 |  | `  else` |
| 30 |  | `    q2 <= d;` |

FIG. 8A

|    | Original | Modified |
|----|----------|----------|
| 1  | `input rst, d, x;` | `input rst, d, x;` |
| 2  | `wire d_rst;` | `wire d_rst;` |
| 3  | `reg g_rst, q1, q2;` | `reg g_rst, q1, q2;` |
| 4  | | |
| 5  | `assign d_rst = 1;` | `// Aded by rtlscan.` |
| 6  | `always @(posedge clk)` | `wire scan_g_rst;` |
| 7  | `  g_rst <= x;` | `wire scan_d_rst;` |
| 8  | | `// Added by rtlscan to fix generated set/reset.` |
| 9  | `// g_rst is generated set/reset.` | `assign scan_g_rst = (~SE) & g_rst;` |
| 10 | `always @(posedge clk or posedge g_rst)` | `// Added by rtlscan to fix destructive set/reset.` |
| 11 | `  if (g_rst)` | `assign scan_d_rst = (~SE) & d_rst;` |
| 12 | `    q1 <= 0;` | |
| 13 | `  else` | `assign d_rst = 1;` |
| 14 | `    q1 <= d;` | `always @(posedge clk)` |
| 15 | | `  g_rst <= x;` |
| 16 | `// d_rst is destructive set/reset.` | |
| 17 | `always @ (posedge clk or posedge d_rst)` | `// Modified by rtlscan to fix set/reset.` |
| 18 | `  if (d_rst)` | `always @(posedge clk or posedge scan_g_rst)` |
| 19 | `    q2 <= 0;` | `  if (scan_g_rst)` |
| 20 | `  else` | `    q1 <= 0;` |
| 21 | `    q2 <= d;` | `  else` |
| 22 | | `    q1 <= d;` |
| 23 | | |
| 24 | | `// Modified by rtlscan to fix set/reset.` |
| 25 | | `always @(posedge clk or posedge scan_d_rst)` |
| 26 | | `  if (scan_d_rst)` |
| 27 | | `    q2 <= 0;` |
| 28 | | `  else` |
| 29 | | `    q2 <= d;` |

FIG. 8B

| | Original | Modified |
|---|---|---|
| 1 | assign c_clk = clk & clk_en; | // Added by rtlscan. |
| 2 | assign const_clk = 0; | wire test_c_clk; |
| 3 | | wire test_g_clk; |
| 4 | always @(posedge clk) | wire test_const_clk; |
| 5 | g_clk = x; | |
| 6 | | // Added by rtlscan to fix generated clock. |
| 7 | // g_clk is generated clock. | assign test_g_clk = (TE)? clk : g_clk; |
| 8 | always @(posedge g_clk or posedge rst) | // Added by rtlscan to fix combinational or sequential |
| 9 | if (rst) | // gated clock. |
| 10 | q1 <= 0; | assign test_c_clk = clk & (clk_en \| SE); |
| 11 | else | //Added by rtlscan to fix constant clock. |
| 12 | q1 <= d; | assign test_const_clk = (TE)? clk : const_clk; |
| 13 | | |
| 14 | // c_clk is combinational gated clock. | always @(posedge clk) |
| 15 | always @(posedge c_clk) | g_clk = x; |
| 16 | q2 <= q1; | |
| 17 | | // Modified by rtlscan to fix clock. |
| 18 | // const_clock is constant clock. | always @(posedge test_g_clk or posedge rst) |
| 19 | always @(posedge const_clk) | if (rst) |
| 20 | q3 <= q2; | q1 <= 0; |
| 21 | | else |
| 22 | | q1 <= d; |
| 23 | | |
| 24 | | // Modified by rtlscan to fix clock. |
| 25 | | always @(posedge test_c_clk) |
| 26 | | q2 <= q1; |
| 27 | | |
| 28 | | // Modified by rtlscan to fix clock. |
| 29 | | always @(posedge test_const_clk) |
| 30 | | q3 <=q2; |

FIG. 9A

| | Original | Modified |
|---|---|---|
| 1 | assign d_in = d & clk; | // Added by rtlscan. |
| 2 | always @(posedge clk or posedge rst) | wire test_clk_to_d; |
| 3 |   if (rst) | |
| 4 |     q <= 0; | // Added by rtlscan to fix clock to data input. |
| 5 |   else | assign test_clk_to_d = TE \| clk; |
| 6 |     q <= d_in; | |
| 7 | | // Modified by rtlscan clock to fix clock to data input. |
| 8 | | assign d_in = d & test_clk_to_d; |
| 9 | | always @(posedge clk or posedge rst) |
| 10 | |   if (rst) |
| 11 | |     q <= 0; |
| 12 | |   else |
| 13 | |     q <= d_in; |

FIG. 10A

|   | Original | Modified |
|---|---|---|
| 1 | always @(en or rst or d) | // Modified by rtlscan to fix a transparent latch. |
| 2 | if (rst) | always @(en or rst or d or TE) |
| 3 | q <= 0; | if (rst) |
| 4 | else if (en) | q <= 0; |
| 5 | q <= d; | else if (en | TE) |
| 6 | | q <= d; |

FIG. 11A

|   | Original | Modified |
|---|---|---|
| 1 | inout abus; | inout abus; |
| 2 | | |
| 3 | assign abus = (tri_en)? data_out : 8'bz; | // Added by rtlscan. |
| 4 | assign data_out = read_mem(abus); | wire scan_tri_en; |
| 5 | | |
| 6 | | // Added by rtlscan to fix bi-directional pin to input mode. |
| 7 | | assign scan_tri_en = (tri_en) & ~SE; |
| 8 | | |
| 9 | | // Modified by rtlscan. |
| 10 | | assign abus = (scan_tri_en)? data_out : 8'bz; |
| 11 | | assign data_out = read_mem(abus); |

FIG. 12A

|   | Original | Modified |
|---|---|---|
| 1 | reg [1:0] c: | reg [1:0] c: |
| 2 | always @(a) | |
| 3 | c = (c > a) ? c : a; | // Added by rtlscan. |
| 4 | | wire [1:0] test_c; |
| 5 | | reg [1:0] scan_c; |
| 6 | | |
| 7 | | // Added by rtlscan to break combinational |
| 8 | | // feedback loop or potential combinational |
| 9 | | // feedback loop. |
| 10 | | always @ (posedge clk) |
| 11 | | begin |
| 12 | | scan_c <= c; |
| 13 | | end |
| 14 | | assign test_c = (TE)? scan_c : c; |
| 15 | | |
| 16 | | // Modified by rtlscan. |
| 17 | | always @(a or test_c) |
| 18 | | c = (test_c > a) ? test_c : a; |

FIG. 13A

|   | Original | Modified |
|---|----------|----------|
| 1 | assign g_rst = q & pulse; | // Added by rtlscan. |
| 2 |  | wire test_g_rst; |
| 3 | always @(posedge clk or posedge g_rst) |  |
| 4 |   if (g_rst) | // Added by rtlscan to fix pulse generator. |
| 5 |     q <= 0; | assign test_g_rst = ~TE & g_rst; |
| 6 |   else |  |
| 7 |     q <= d; | assign g_rst = q & pulse; |
| 8 |  |  |
| 9 |  | // Modified by rtlscan. |
| 10 |  | always @(posedge clk or posedge test_g_rst) |
| 11 |  |   if (test_g_rst) |
| 12 |  |     q <= 0; |
| 13 |  |   else |
| 14 |  |     q <= d; |

FIG. 14A

| | Original | Modified |
|---|---|---|
| 1 | reg [3:0] tri_en; | reg [3:0] tri_en; |
| 2 | always @(posedge clk) | |
| 3 | begin | // Added by rtlscan. |
| 4 |   case (bus_sel) | wire [3:0] scan_tri_en; |
| 5 |   0: tri_en[0] = 1'b1; | |
| 6 |   1: tri_en[1] = 1'b1; | // Added by rtlscan to fix bus contention. |
| 7 |   2: tri_en[2] = 1'b1; | assign scan_tri_en[0] = (SE) \| (tri_en[0]); |
| 8 |   3: tri_en[3] = 1'b1; | assign scan_tri_en[1] = (~SE) & (tri_en[1]); |
| 9 |   endcase | assign scan_tri_en[2] = (~SE) & (tri_en[2]); |
| 10 | end | assign scan_tri_en[3] = (~SE) & (tri_en[3]); |
| 11 | | |
| 12 | assign dbus = (tri_en[0])? d1 : 8'bz; | always @(posedge clk) |
| 13 | assign dbus = (tri_en[1])? d2 : 8'bz; | begin |
| 14 | assign dbus = (tri_en[2])? d3 : 8'bz; |   case (bus_sel) |
| 15 | assign dbus = (tri_en[3])? d4 : 8'bz; |   0: tri_en[0] = 1'b1; |
| 16 | |   1: tri_en[1] = 1'b1; |
| 17 | |   2: tri_en[2] = 1'b1; |
| 18 | |   3: tri_en[3] = 1'b1; |
| 19 | |   endcase |
| 20 | | end |
| 21 | | |
| 22 | | // Modified by rtlscan to fix bus contention. |
| 23 | | assign dbus = (scan_tri_en[0])? d1 : 8'bz; |
| 24 | | assign dbus = (scan_tri_en[1])? d2 : 8'bz; |
| 25 | | assign dbus = (scan_tri_en[2])? d3 : 8'bz; |
| 26 | | assign dbus = (scan_tri_en[3])? d4 : 8'bz; |

FIG. 15A

| | Original | Modified |
|---|---|---|
| 1 | `reg[8:0] count_reg;` | `reg[8:0] count_reg;` |
| 2 | `wire each8;` | `wire each8;` |
| 3 | | |
| 4 | `always @(posedge clk)` | `// Added by rtlscan.` |
| 5 | `  if (running)` | `reg[1:0] ctrl_reg;` |
| 6 | `    count_reg = 0;` | |
| 7 | `  else` | `// Added by rtlscan to model 1-bit OR-control point in (D).` |
| 8 | `    count_reg = count_reg + 1;` | `function add_or_ctrl_point_1bit;` |
| 9 | | `input input_net;` |
| 10 | `assign each8 = ((count_reg % 8) == 7);` | `input test_input` |
| 11 | `assign count72 = (count_reg == 71);` | `input te;` |
| 12 | `assign count8 = each8 & ~count72;` | `add_or_ctrl_point_1bit = input_net | (te & test_input);` |
| 13 | | `endfunction` |
| 14 | | |
| 15 | | `// Added by rtlscan to model 1-bit AND-control point in (D).` |
| 16 | | `function add_and_ctrl_point_1bit;` |
| 17 | | `input input_net;` |
| 18 | | `input test_input;` |
| 19 | | `input te;` |
| 20 | | `add_and_ctrl_point_1bit = input_net & (~te | test_input);` |
| 21 | | `endfunction` |
| 22 | | |
| 23 | | `// Added by rtlscan to model control register.` |
| 24 | | `always @(posedge clk)` |
| 25 | | `  ctrl_reg <= ctrl_reg;` |
| 26 | | |
| 27 | | `always @(posedge clk)` |
| 28 | | `// Add OR-control point.` |
| 29 | | `  if (add_or_ctrl_point_1bit(running, ctrl_reg[0], TE))` |
| 30 | | `    count_reg = 0;` |
| 31 | | `  else` |
| 32 | | `    count_reg = count_reg + 1;` |
| 33 | | |
| 34 | | `assign each8 = ((count_reg % 8) == 7);` |
| 35 | | `assign count72 = (count_reg == 71);` |
| 36 | | |
| 37 | | `// Add AND-control point in (D).` |
| 38 | | `assign count8 = (add_and_ctrl_point_1bit(each8,` |
| 39 | | `                  ctrl_reg[1], TE)) & ~count72;` |

FIG. 16A

| | Original | Modified |
|---|---|---|
| 1 | `reg[8:0] count_reg;` | `reg[8:0] count_reg;` |
| 2 | `wire each8;` | `wire each8;` |
| 3 | | |
| 4 | `always @(posedge clk)` | `// Added by rtlscan.` |
| 5 | `  if (running)` | `reg[1:0] ctrl_reg;` |
| 6 | `    count_reg = 0;` | |
| 7 | `  else` | `// Added by rtlscan to model 1-bit MUX-control point in (E).` |
| 8 | `    count_reg = count_reg + 1;` | `function add_mux_ctrl_point_1bit;` |
| 9 | | `input input_net;` |
| 10 | `assign each8 = ((count_reg % 8) == 7);` | `input test_input` |
| 11 | `assign count72 = (count_reg == 71);` | `input te;` |
| 12 | `assign count8 = each8 & ~count72;` | `add_mux_ctrl_point_1bit = (te)? test_input : input_net;` |
| 13 | | `endfunction` |
| 14 | | |
| 15 | | `// Added by rtlscan to model 1-bit XOR-control point in (E).` |
| 16 | | `function add_xor_ctrl_point_1bit;` |
| 17 | | `input input_net;` |
| 18 | | `input test_input;` |
| 19 | | `input te;` |
| 20 | | `add_xor_ctrl_point_1bit = input_net ^ (te & test_input);` |
| 21 | | `endfunction` |
| 22 | | |
| 23 | | `// Added by rtlscan to model control register.` |
| 24 | | `always @(posedge clk)` |
| 25 | | `  ctrl_reg <= ctrl_reg;` |
| 26 | | |
| 27 | | `always @(posedge clk)` |
| 28 | | `// Add MUX-control point.` |
| 29 | | `  if (add_mux_ctrl_point_1bit(running, ctrl_reg[0], TE))` |
| 30 | | `    count_reg = 0;` |
| 31 | | `  else` |
| 32 | | `    count_reg = count_reg + 1;` |
| 33 | | |
| 34 | | `assign each8 = ((count_reg % 8) == 7);` |
| 35 | | `assign count72 = (count_reg == 71);` |
| 36 | | |
| 37 | | `// Add XOR-control point in (E).` |
| 38 | | `assign count8 = (add_xor_ctrl_point_1bit(each8,` |
| 39 | | `                  ctrl_reg[1], TE)) & ~count72;` |

FIG. 16B

| | Original | Modified |
|---|---|---|
| 1 | always @(posedge clk) | // Added by rtlscan. |
| 2 |   if (running) | wire[1:0] obsv_point; |
| 3 |     count_reg = 0; | reg[1:0] obsv_reg; |
| 4 |   else | |
| 5 |     count_reg = count_reg + 1; | // Added by rtlscan to model 1-bit observation point. |
| 6 | | task add_obsv_point_1bit; |
| 7 | assign each8 = ((count_reg % 8) == 7); | input input_net; |
| 8 | assign count72 = (count_reg == 71); | output obsv; |
| 9 | assign count8 = each8 & ~count72; | obsv = input_net; |
| 10 | | endtask |
| 11 | | |
| 12 | | // Add normal observation point in (D). |
| 13 | | always |
| 14 | | begin |
| 15 | |   add_obsv_point_1bit(running, obsv_point[0]); |
| 16 | |   add_obsv_point_1bit(each8, obsv_point[1]); |
| 17 | | end |
| 18 | | |
| 19 | | // Added by rtlscan to model observation register. |
| 20 | | always @(posedge clk) |
| 21 | |   obsv_reg <= obsv_point; |
| 22 | | |
| 23 | | always @(posedge clk) |
| 24 | |   if (running) |
| 25 | |     count_reg = 0; |
| 26 | |   else |
| 27 | |     count_reg = count_reg + 1; |
| 28 | | |
| 29 | | assign each8 = ((count_reg % 8) == 7); |
| 30 | | assign count72 = (count_reg == 71); |
| 31 | | assign count8 = each8 & ~count72; |

FIG. 17A

| | Original | Modified |
|---|---|---|
| 1 | always @(posedge clk) | // Added by rtlscan. |
| 2 | if (running) | wire[1:0] obsv_point; |
| 3 | count_reg = 0; | |
| 4 | else | // Added by rtlscan to model 1-bit observation point. |
| 5 | count_reg = count_reg + 1; | task add_obsv_point_1bit; |
| 6 | | input input_net; |
| 7 | assign each8 = ((count_reg % 8) == 7); | output obsv; |
| 8 | assign count72 = (count_reg == 71); | obsv = input_net; |
| 9 | assign count8 = each8 & ~count72; | endtask |
| 10 | | |
| 11 | | // Add XOR-observation point in {E}. |
| 12 | | always |
| 13 | | begin |
| 14 | | add_obsv_point_1bit(running, obsv_point[0]); |
| 15 | | add_obsv_point_1bit(each8, obsv_point[1]); |
| 16 | | end |
| 17 | | |
| 18 | | // Added by rtlscan to XOR-observation points to primary output. |
| 19 | | assign d_out = ^obsv_point; |
| 20 | | |
| 21 | | always @(posedge clk) |
| 22 | | if (running) |
| 23 | | count_reg = 0; |
| 24 | | else |
| 25 | | count_reg = count_reg + 1; |
| 26 | | |
| 27 | | assign each8 = ((count_reg % 8) == 7); |
| 28 | | assign count72 = (count_reg == 71); |
| 29 | | assign count8 = each8 & ~count72; |

FIG. 17B

| | Original | Modified |
|---|---|---|
| 1 | `always @(posedge clk)` | `// Added by rtlscan.` |
| 2 | `  if (running)` | `wire[1:0] obsv_point;` |
| 3 | `    count_reg = 0;` | `wire scan_point;` |
| 4 | `  else` | `reg obsv_reg, scan_reg;` |
| 5 | `    count_reg = count_reg + 1;` | |
| 6 | | `//Added by rtlscan to model 1-bit observation point.` |
| 7 | `assign each8 = ((count_reg % 8) == 7);` | `task add_obsv_point_1bit;` |
| 8 | `assign count72 = (count_reg == 71);` | `input input_net;` |
| 9 | `assign count8 = each8 & ~count72;` | `output obsv;` |
| 10 | | `obsv = input_net;` |
| 11 | | `endtask` |
| 12 | | |
| 13 | | `// Added by rtlscan to model 1-bit scan point.` |
| 14 | | `function add_scan_point_1bit;` |
| 15 | | `input input_net;` |
| 16 | | `input test_input` |
| 17 | | `input te;` |
| 18 | | `scan_point = input_net;` |
| 19 | | `add_scan_point_1bit = (te)? test_input : input_net;` |
| 20 | | `endfunction` |
| 21 | | |
| 22 | | `// Add XOR-observation point in (F).` |
| 23 | | `always` |
| 24 | | `begin` |
| 25 | | `  add_obsv_point_1bit(running, obsv_point[0]);` |
| 26 | | `  add_obsv_point_1bit(each8, obsv_point[1]);` |
| 27 | | `end` |
| 28 | | |
| 29 | | `always @(posedge clk)` |
| 30 | | `begin` |
| 31 | | `// Added by rtlscan to model XOR-observation register.` |
| 32 | | `  obsv_reg <= ^obsv_point;` |
| 33 | | `// Added by rtlscan to model scan register.` |
| 34 | | `  scan_reg <= scan_point;` |
| 35 | | `end` |
| 36 | | |
| 37 | | `always @(posedge clk)` |
| 38 | | `  if (running)` |
| 39 | | `    count_reg = 0;` |
| 40 | | `  else` |
| 41 | | `    count_reg = count_reg + 1;` |
| 42 | | |
| 43 | | `assign each8 = ((count_reg % 8) == 7);` |
| 44 | | `assign count72 = (count_reg == 71);` |
| 45 | | `// Add scan point in (F).` |
| 46 | | `assign count8 = each8 & (add_scan_point_1bit(~count72,` |
| 47 | | `                    scan_reg, TE));` |

FIG. 17C

| | Original | Modified |
|---|---|---|
| 1 | module scan1 (clk, d, q); | module scan1 (SE, clk, SI, d, q, SO); |
| 2 | input clk; | input clk; |
| 3 | input [1:0] d; | input SE; |
| 4 | output [1:0] q; | input SI; |
| 5 | | input [1:0] d; |
| 6 | reg[1:0] q; | output [1:0] q; |
| 7 | reg[1:0] x; | output SO; |
| 8 | | reg[1:0] q; |
| 9 | always @(posedge clk) | reg[1:0] x; |
| 10 | begin | |
| 11 | q <= d; | always @(posedge clk) |
| 12 | x <= q + 1; | begin |
| 13 | end | q <= d; |
| 14 | endmodule | x <= q + 1 ; |
| 15 | | // Added by rtlscan for scan replacement and scan |
| 16 | | // stitching. |
| 17 | | if (SE) |
| 18 | | begin |
| 19 | | q[0] <= SI; |
| 20 | | q[1] <= q[0]; |
| 21 | | x[0] <= q[1]; |
| 22 | | x[1] <= x[0]; |
| 23 | | end |
| 24 | | end |
| 25 | | assign SO <= x[1]; |
| 26 | | endmodule |

FIG. 18

```
1   1. Command: set_port -type [SCAN-IN|SCAN-OUT] [port name]
2      Description:
3         Inform the program the port names of scan in and scan out ports.
4      Option:
5         -type [SCAN-IN|SCAN-OUT]
6           Assign the port type.
7
8   2. Command: extract -chain [chain name] -o [file name]
9      Description:
10        Trace the RTL codes based on the specified scan in and scan out ports, and save
11        the found scan chains in a specified file.
12     Option:
13        -chain [chain name]
14          Give the found scan chain a label for future reference.
15        -o[file name]
16          Save the list of found scan chains into the specified file.
17
18  Example: Perform scan extraction on FIG. 18.
19     RTLScan> set_port -type SCAN-IN SI
20     RTLScan> set_port -type SCAN-OUT SO
21     RTLScan> extract -chain chain_1 -o chain_1.pso
22     RTLScan> list of chain_1
23              {q[0], q[1], x[0], x[1]}
24     RTLScan> list of scan chains has been saved in chain_1.pso
```

FIG. 19

```
1    1. Command: force [port name] [pattern]
2       Description:
3          Apply an input pattern to the specified port.
4    2. Command: force_clock [clock port] [pattern]
5       Description:
6          Apply a clock pattern to a clock port.
7    3. Command: trace_fanin [variable|port]
8       Description:
9          Show the fanin variable or the port name and the original RTL source code.
10   4. Command: trace_fanout [variable|port]
11      Description:
12         Show the fanout variable or the port name and the original RTL source code.
13   5. Command: flush_test [cycle]
14      Description:
15         Perform scan flush test for the specified number of clock cycles.
16
17   Example: Perform flush test on Fig. 18 code for 1000 cycles.
18      RTLScan> force SI 0000
19      RTLScan> force SE 1
20      RTLScan> force_clock clk 010
21      RTLScan> flush_test 1000
22      RTLScan> trace_fanin q[1]
23      RTLScan>
24      RTLScan> q[0]  Type: reg  Value: 0
25               "test.v": #19: q[1] <= q[0];
26      RTLScan>
27      RTLScan> trace_fanin q[0]
28      RTLScan> SI  Type: Input  Value: 0
29               "test.v": #18: q[0] <= SI;
30      RTLScan>
31      RTLScan> trace_fanout x[0]
32      RTLScan> x[1]  Type: reg  Value: 0
33               "file.v": #21: x[1] <= x[0];
```

FIG. 20

| | |
|---|---|
| 1 | RTLScan> scandrc -gated_clock |
| 2 | 1: (SC-21): "test.v" : #23: "c_clk" is a combinational gated clock. |
| 3 | RTLScan> scandrc -fix 1 |
| 4 | RTLScan> suggestion: |
| 5 | assign test_c_clk = clk & (clk_en | TE); |
| 6 | always @(posedge test_c_clk or posedge rst) |
| 7 | RTLScan> Press "A" to accept the suggestion or "S" to skip the error |
| 8 | RTLScan> A |
| 9 | RTLScan> RTL code modified |

FIG. 21

```
1   %TEST_CONVERSION // In non-overlapping mode.
2   {
3       %SET_TIMING
4       {
5           %CYCLE = 100;                    // The chosen ATE cycle time is 100ns.
6           %PI_TIME = 5 SE, TE;             // Both SE and TE change values at 5ns.
7           %DEFAULT_PI_TIME = 10;           // All data inputs change values at 10ns.
8           %P_CLOCK = 20 30 SCK1;           // The SCK1 clock rises at 20ns and falls at 30ns.
9           %P_CLOCK = 40 50 SCK2;           // The SCK2 clock rises at 40ns and falls at 50ns.
10          %P_CLOCK = 60 70 SCK3;           // The SCK3 clock rises at 60ns and falls at 70ns.
11          %P_CLOCK = 80 90 SCK4;           // The SCK4 clock rises at 80ns and falls at 90ns.
12          %DEFAULT_PO_TIME = 99;           // All primary outputs will be strobed at 99ns.
13          %DEFAULT_IO_TIME = 10 99;        // All bi-directional inputs change values at 10ns.
14                                           // All bi-directional outputs will be strobed at 99ns.
15      }
16  }
17
18  %TEST_CONVERSION // In overlapping mode.
19  {
20      %SET_TIMING
21      {
22          %CYCLE = 100;                    // The chosen ATE cycle time is 100ns.
23          %PI_TIME = 5 SE, TE;             // Both SE and TE change values at 5ns.
24          %DEFAULT_PI_TIME = 10;           // All data inputs change values at 10ns.
25          %P_CLOCK = 20 60 SCK1;           // The SCK1 clock rises at 20ns and falls at 60ns.
26          %P_CLOCK = 30 70 SCK2;           // The SCK2 clock rises at 30ns and falls at 70ns.
27          %P_CLOCK = 40 80 SCK3;           // The SCK3 clock rises at 40ns and falls at 80ns.
28          %P_CLOCK = 50 90 SCK4;           // The SCK4 clock rises at 50ns and falls at 90ns.
29          %DEFAULT_PO_TIME = 99;           // All primary outputs will be strobed at 99ns.
30          %DEFAULT_IO_TIME = 10 99;        // All bi-directional inputs change values at 10ns.
31                                           // All bi-directional outputs will be strobed at 99ns.
32      }
33  }
34
35  %TEST_CONVERSION // In one-hot mode.
36  {
37      %SET_TIMING
38      {
39          %CYCLE = 100;                    // The chosen ATE cycle time is 100ns.
40          %PI_TIME = 5 SE, TE;             // Both SE and TE change values at 5ns.
41          %DEFAULT_PI_TIME = 10;           // All data inputs change values at 10ns.
42          %P_CLOCK = 20 60 SCK1;           // The SCK1 clock rises at 20ns and falls at 60ns.
43          %P_CLOCK = 20 60 SCK2;           // The SCK2 clock rises at 20ns and falls at 60ns.
44          %P_CLOCK = 20 60 SCK3;           // The SCK3 clock rises at 20ns and falls at 60ns.
45          %P_CLOCK = 20 60 SCK4;           // The SCK4 clock rises at 20ns and falls at 60ns.
46          %DEFAULT_PO_TIME = 99;           // All primary outputs will be strobed at 99ns.
47          %DEFAULT_IO_TIME = 10 99;        // All bi-directional inputs change values at 10ns.
48                                           // All bi-directional outputs will be strobed at 99ns.
49      }
50  }
```

FIG. 22

COMPUTER-AIDED DESIGN SYSTEM TO AUTOMATE SCAN SYNTHESIS AT REGISTER-TRANSFER LEVEL

RELATED APPLICATION DATA

This application is a division of U.S. patent application Ser. No. 13/490,721, filed Jun. 7, 2012 now U.S. Pat. No. 8,543,950, which is a continuation of U.S. patent application Ser. No. 13/030,410, filed Feb. 18, 2011 (now U.S. Pat. No. 8,219,945), which is a continuation of U.S. patent application Ser. No. 11/984,316, filed Apr. 22, 2005 (now U.S. Pat. No. 7,331,032), which is a division of U.S. patent application Ser. No. 10/108,238, filed Mar. 28, 2002 (now U.S. Pat. No. 6,957,403), which claims the benefit of U.S. Provisional Application No. 60/279,710 filed Mar. 29, 2001, each of which is hereby incorporated by reference and for each of which priority is claimed.

TECHNICAL FIELD

The present invention generally relates to the field of Computer-aided design (CAD) system using design-for-test (DFT) techniques. Specifically, the present invention relates to the field of Computer-aided design (CAD) system for performing scan synthesis in integrated circuits modeled at register-transfer level (RTL).

BACKGROUND

The design methodology for complex integrated circuit (IC) designs has evolved with the advancement in process technologies. Currently, hardware description languages (HDL) are widely used to describe the behavior of a circuit at different levels of abstraction. The most commonly used approach is using HDL, such as Verilog or VHDL, to describe the circuit at register-transfer level (RTL). A computer-aided design (CAD) tool, generally called logic synthesizer, is then used to transform the above HDL design description into a technology dependent gate-level netlist, taking into account user-specified constraints on timing, power, area, etc.

Integrated circuits need to be tested in order to verify the correctness of their functionality. With the ever-growing complexity of integrated circuits, the testing cost has become a significant portion of the total manufacturing cost. Hence, testability issues should be taken seriously in the design process. The reason that a design with better testability usually results in lower test generation and test application costs.

There are many techniques to improve the testability of a design and reduce the costs for test generation and test application. These techniques are generally referred to as DFT (design-for-test) techniques. Among various DFT techniques, the scan-based DFT technique is the most widely used. In a scan-based design, scan storage elements, called scan cells, are used to replace original storage elements (flip-flops and latches). Some additional logic may also be added to the original design. As a result, the controllability and observability of the design will be greatly enhanced. In addition, test points, both control points and observation points, can be inserted into the original design to further improve its controllability and observability. The process of repairing scan-based DFT rule violations, inserting test points, replacing original storage elements with scan cells, and stitching the scan cells together as scan chains forms the basis of a scan synthesis CAD system.

Prior-art scan synthesis solutions start with a technology-dependent gate-level netlist. This means that, even though a modern IC design is often coded at RTL, it must be first synthesized into a gate-level netlist in order to conduct scan synthesis. This Scan-after-Logic-Synthesis design flow is time-consuming, inefficient, and difficult to meet design constraints. In such a design flow, when an integrated circuit design contains any DFT rule violations, they must be repaired at gate-level. In addition, replacing an original storage element with a scan cell and adding test points are also conducted on the gate-level netlist. However, the logic added to fix DFT rule violations and to improve fault coverage may violate user-specified design constraints, be it power, timing, or area. Although designers may choose to rewrite RTL codes to fix such problems, it requires re-compilation and re-synthesis, which consumes a lot of time and effort. Moreover, it has to be repeated multiple times until all DFT rule violations are fixed. The product life cycle of a modern IC design is very short. Fixing DFT problems at such a late stage in a design flow may cause the product to miss the market window and incur huge revenue losses.

An alternative prior-art approach, aimed at eliminating or reducing the number of iterations in a design flow, is to perform scan synthesis during logic synthesis. Logic synthesis generally contains two major steps: generic transformation and technology mapping (including logic optimization). Generic transformation is to synthesize RTL codes into a generic technology-independent gate-level model. Technology mapping is to map the generic gate-level model into a technology dependent gate-level netlist, based on user-specified constraints and a given cell library. Scan synthesis now can be performed between generic transformation and technology mapping. This Scan-within-Logic-Synthesis is also called one-pass scan synthesis or one-pass test synthesis. In principle, this approach still works at gate-level and solely relies on designers to fix most, if not all, DFT rule violations at RTL first. The main advantage of the Scan-within-Logic-Synthesis approach over the Scan-after-Logic-Synthesis approach is that it does not need to go through the lengthy technology mapping to locate DFT rule violations, if any. The disadvantage of the Scan-within-Logic-Synthesis approach, however, is that designers must guarantee their RTL codes to be testable before one-pass scan synthesis is performed.

In order to solve the problem with the current Scan-within-Logic-Synthesis approach, three prior-art solutions are available: one for test point insertion in an unmapped gate-level netlist (prior-art solution #1), one for test point insertion at RTL (prior-art solution #2), and one for scan insertion at RTL (prior-art solution #3) as summarized bellow:

Prior-art solution #1 is described in U.S. Pat. No. 6,311,317 by Khoche, et al. (2001). This solution adds test points to an unmapped gate-level netlist, removing the need of adding test points to a gate-level netlist obtained after logic synthesis. This solution, however, suffers from a major disadvantage. That is, this solution does not perform any analysis on an unmapped gate-level netlist to guide designers in choosing test points. As a result, user inputs should be provided to specify test points. This is not only time-consuming but also inefficient in some cases when less-effective test points are specified.

Prior-art solution #2 is described in U.S. Pat. No. 6,301,688 by Roy, et al. (2001). This solution selects test points at RTL based on a cost function derived from the controllability and observability measures. A list of candidate test points is first constructed. For each test point candidate, the solution computes a cost function that models the average number of pseudorandom patterns required to detect a fault, over the complete fault set. The candidate test point, which results in the largest reduction in the cost function, is then selected. This test point selection process is repeated until the estimated fault coverage meets the user-specified requirement, or the number of selected test points exceeds the user-specified limit. The disadvantage of this solution is that it solely relies on a computed cost function to guide test point selection, which is not always accurate. As a result, this solution may yield a less-effective set of test points since no interactive test point selection is supported.

Prior-art solution #3 is described in U.S. Pat. No. 6,256,770 by Pierce, et al. (2001). This solution performs scan insertion, including scan replacement and scan stitching, at RTL. This solution, however, suffers from several disadvantages: First, this solution does not take the concept of multiple clock domains into consideration. It basically assumes that all RTL modules will be implemented on a single clock domain. This is not a practical assumption since most modern IC designs consist of multiple clock domains, operating at a signal frequency or multiple frequencies. Second, this solution does not take the concept of hierarchical scan synthesis into consideration. Given the fact that modern IC designs are growing rapidly in size and complexity, any non-scalable solution without supporting hierarchical scan synthesis will be of only limited use. Third, this solution does not support scan repair, which is indispensable in preparing a design for scan synthesis. In fact, a complex RTL design may contain many scan DFT rule violations, such as asynchronous set/reset signals, generated clocks, constant clocks, clocks connected to data inputs of storage elements, gated clocks, latches, bi-directional ports, combinational feedback loops, pulse generators, tri-state busses, etc. Such violations must be fixed before scan insertion. Fourth, this solution does not support scan extraction, which is often needed to extract scan information from a scanned RTL design. Fifth, this solution does not support interactive scan debug and interactive scan repair, which are important when scan chains do not operate as intended.

In order to solve the disadvantages of prior-art solution, the present invention employs a new approach called Scan-before-Logic-Synthesis to move scan synthesis completely to the register-transfer level (RTL). The present invention will perform scan synthesis completely before logic synthesis, based on testability analysis, clock domain analysis, and user constraints. This Scan-before-Logic-Synthesis approach will allow designers to find all DFT rule violations at RTL and fix them by hand or by software. The present invention performs scan insertion and test point insertion at RTL and generate testable RTL codes for synthesis and verification. With the present invention, designers can verify scanned codes at RTL. The verified RTL codes can then be synthesized using any commercially available logic synthesis tool, based on original design constraints. The present invention can avoid costly iterations caused by scan chain insertion, test point insertion, and DFT violation repair at gate-level. In one embodiment of the present invention, the CAD system supports hierarchical RTL scan synthesis by allowing designers to conduct RTL scan synthesis module-by-module, and then stitching the scanned RTL modules hierarchically up to the top-level module.

Accordingly, what is needed in this present invention is a computer-aided design (CAD) system for effectively automating RTL scan synthesis or Scan-before-Logic-Synthesis, whose advantages are listed above. The CAD system can generate flush and random test benches to verify and debug scanned RTL codes. In addition, hierarchical test benches can also be generated to verify and debug the scanned RTL design at top-level.

The following table summarizes the results of analyzing different synthesis approaches:

| Feature | Synthesis | | |
| --- | --- | --- | --- |
| | Scan-after-Logic | Scan-within-Logic | Scan-before-Logic |
| Input Model | Gate-Level | RTL | RTL |
| Output Model | Gate-Level | Gate-Level | RTL |
| Timing Closure | Difficult | Medium | Easy |
| Synthesis Time | Long | Medium | Short |

SUMMARY

Accordingly, a primary objective of the present invention is to provide such an improved Scan-before-Logic-Synthesis system, comprising a computer-aided design (CAD) system for RTL scan synthesis. The inputs to the CAD system are RTL codes described in HDL (hardware description language) and scan constraints. The RTL codes for any integrated circuit can be in such a format as Verilog, VHDL, etc. The CAD system for RTL scan synthesis will consist of a suite of programs for performing such tasks as RTL testability analysis, clock-domain minimization, scan and test point selection, scan repair and test point insertion, scan replacement and scan stitching, scan extraction, interactive scan debug, interactive scan repair, and test bench generation. The Scan-before-Logic-Synthesis CAD system in accordance with the present invention is summarized as follows:

(1) RTL Compilation

Assume that an integrated circuit modeled at RTL is described in HDL, such as Verilog, VHDL, etc. RTL compilation will compile the RTL codes into a design database for all subsequent tasks. The design database captures the RTL circuit model which in essence are connections between RTL operators like adder, subtractor, multiplier, comparator, multiplexer, etc. Since not all nets in RTL nets are visible from the RTL codes, an index is given to each net in the RTL circuit. Cross probing is provided for all nets and RTL operators in the RTL circuit to the original RTL codes. The flip-flops, latches, and tri-state busses are inferred from the RTL codes.

(2) Testability Analysis at RTL

The present invention comprises any software that uses a CAD method to perform testability analysis on the design database to check whether the RTL codes contain any coding and DFT rule violations. In addition to reporting such violations as floating primary inputs, floating primary outputs, floating bi-directional pins, objects with floating inputs or outputs, floating nets, and transparent patches, the CAD system also reports such unique information as combinational feedback loops, potentially combinational feedback loops, generated clocks, sequentially gated clocks, combinationally gated clocks, constant clocks, connections from clocks to flip-flop or latch inputs, connections from clocks to output ports, connections to both clock and data inputs of a flip-flop or latch, generated set/reset signals, sequentially gated set/reset signals, combinationally gated set/reset signals, destructive set/reset signals, crossing clock domains, pulse generators, potential bus contentions, etc. If any such violation is found, the violation will be recorded and a summary of the violations will be reported. The testability analysis also generates clock domain analysis results that will be used in clock domain minimization. Controllability and observability measures are computed for all nets to the bit-level accuracy. These testability measures will be used as references to guide interactive test point insertion at RTL.

(3) Single-Frequency Clock-Domain Minimization at RTL

The present invention further comprises any software that uses a CAD method to perform clock-domain analysis based on the RTL codes of an integrated circuit in order to identify clock domains that do not interact with each other. The CAD method starts from clock input signals in the analysis process and generates a minimum set of scan clocks needed to test the integrated circuit at a reduce clock speed but concurrently. This RTL clock-domain analysis will result in less memory usage in fault simulation or test pattern generation and shorter test time. The present invention further comprises any apparatus that can merge and share scan clocks with primary data input pins.

For example, consider an integrated circuit with 8 clock domains, CD1 to CD8, controlled by 8 clocks, CK1 to CK8, respectively. Assume that one clock frequency, which may be applied with several different clock phases, is to be used to test the integrated circuit on an ATE (automatic test equipment). Conventionally, in order to test all clock domains, 8 different set of clock waveforms need to be applied. However, if two clock domains, e.g. CD2 and CD4, have no crossing clock-domain logic between them, in other words, if CD2 and CD4 do not interact with each other, the same set of clock waveforms can be applied to both CD2 and CD4.

(4) Multiple-Frequency Clock-Domain Minimization at RTL

The present invention further comprises any software that uses a CAD method to perform clock-domain analysis based on the RTL codes of an integrated circuit in order to identify clock domains that do not interact with each other. The CAD method starts from clock input signals in the analysis process and generates the minimum set of scan clocks needed to test the integrated circuit at its intended clock frequency or at-speed. If used in scan-test mode, this RTL clock-domain analysis will result in less memory usage in fault simulation or test pattern generation and shorter test time. If used in self-test mode, this RTL clock-domain analysis will result in less memory usage is self-test circuitry synthesis, smaller self-test circuitry, shorter fault simulation time, and shorter test time. The present invention further comprises any apparatus that can merge and share scan clocks with primary data input pins.

For example, consider an integrated circuit with 8 clock domains, CD1 to CD8, controlled by 8 clocks, CK1 or CK8, respectively. Assume that each clock domain is to be tested at its intended clock frequency or at-speed. Conventionally, in order to test all clock domains, 8 different set of clock waveforms need to be applied. However, if two clock domains running at the same frequency, e.g. CD2 and CD4, have no crossing clock-domain logic between them, in other words, if CD2 and CD4 do not interact with each other, the same set of clock waveforms can be applied to both CD2 and CD4.

(5) Scan and Test Point Selection at RTL

In order to reduce test time and test costs on an ATE (automatic test equipment), an integrated circuit is usually configured into having multiple scan chains. Scan chains are constructed based on the results of RTL testability analysis and clock domain minimization as described in (2), (3), and (4), as well as user-specified scan constraints. The CAD system will perform further analysis to decide the scan clock for each scan chain, balance the scan chain length when desired, and order the scan cells based on the clock domains when the scan chain consists of scan cells from different clock domains. Grouping and ordering of scan cells based on clock domains are useful to reduce the complication of clock skews and routing difficulties.

The CAD system can select only part of storage elements as scan cells, resulting in a partial-scan design, which can reduce the area overhead, routing difficulties, and performance degradation potentially associated with a full-scan or almost full-scan design. Especially, one can choose to select only part of storage elements as scan cells in such a manner that all sequential feedback loops are virtually removed through replacing original storage elements with scan cells. The resultant partial-scan design, called a feed-forward partial-scan or a pipe-lined partial-scan design, may have several non-scanned storage elements between two stages of scan cells. This property is characterized by sequential cell-depth. For example, a partial-scan design of a sequential cell-depth of 2 means that a signal value can be propagated from one stage of scan cells to another by applying at most two clock pulses. Note that a full-scan or almost full-scan design has a sequential cell-depth of 0. The CAD system can select scan cells for a partial-scan design based on the sequential cell-depth specified in scan constraints.

In addition, an integrated circuit could contain complex combinational logic blocks and large macro cells such as memories and mixed-signal blocks. In order to test the complex combinational logic blocks and the shadow logic surrounding the macro cells, it might be required to add test points, including control points, observation points, and control-observation points (called scan points). Furthermore, if an integrated circuit is to be tested with pseudorandom test patterns in self-test mode, test points may also need to be added since the circuit may contain a substantially large number of random pattern-resistant faults. The testability measures computed in RTL testability analysis can be used to guide test points insertion to improve the fault coverage of the integrated circuit. The designer can also interactively select a test point or a set of test points and let the system re-compute the estimated fault coverage for the integrated circuit. This interactive test point selection increases the flexibility and the chance of improving the circuit's fault coverage.

The present invention further comprises any software using a CAD system to first identify scan cells and test points, and then build scan chains based upon the scan clocks derived as the result of single-frequency clock-domain minimization at RTL and multiple-frequency clock-domain minimization at RTL, as well as user-specified scan constraints. The order of scan cells at this stage is determined based on module names and instance names. This order may not be final as it can be easily changed at a later stage when layout information becomes available.

(6) Scan Repair and Test Point Insertion at RTL

The scan chains constructed as the result of (5) may not function properly and the design may suffer from low fault coverage if the design contains any unfixed DFT rule violation. The most common DFT rule violations include generated clocks, constant clocks, asynchronous set/reset signals, potential bus contentions, transparent latches, gated clocks, combinational feedback loops, etc. If any scan-based DFT rule violations are found during RTL testability analysis, the designer can either fix the violations manually on the RTL codes, or resort to the CAD system to repair the violations automatically. Two additional input signals, one being a scan enable signal SE and the other being a test enable signal TE, can be added to the RTL codes for this purpose. The two enable signals, SE and TE, will be used to control the operation of added scan logic so that the circuit can function correctly during scan operations. Depending on the type of the violation, an enable signal, SE or TE, can be used to repair the violation. The following table summarizes the circuit operation mode under different SE and TE values.

| TE | SE | Mode |
| --- | --- | --- |
| 0 | 0 | normal |
| 1 | 1 | shift |
| 1 | 0 | hold and capture |

In addition, the CAD system will use either of the two enable signals, TE and SE, to add test points, including control points and observation points. A control point can be implemented with an AND gate, OR gate, multiplexer, or XOR gate; an observation point can be implemented with a new storage element or an XOR gate coupled to an existing storage element or primary output.

The present invention further comprises any software using a CAD system to automatically repair any DFT rule violations found during RTL testability analysis, such as generated clocks, constant clocks, clocks connected to data input, asynchronous set/reset signals, potential bus contentions, transparent latches, gated clocks, combinational feedback loops, etc. In addition, it further comprises any software using a CAD system to insert the selected test points.

(7) Scan Replacement and Scan Stitching at RTL

The storage elements identified during scan selection should be replaced with RTL codes representing scan cells after scan selection. Scan logic is added to make latches transparent during test. Then, all scan cells should be stitched together based on the scan chain order determined in the scan and test point selection stage.

The present invention further comprises any software using a CAD system to replace the storage elements identified during scan and test point selection with RTL codes representing scan cells and making latches transparent during test. In addition, the CAD system stitches all identified scan cells, either at the module level or at the top level. The scan enable signal SE is also connected in this stage to form complete scan chains.

(8) Scan Extraction at RTL

An integrated circuit can contain third-party scanned IP's (intellectual properties), such as CPU or DSP cores. It is important that such cores shall be tested properly. For this purpose, scan extraction is performed to extract the already existed scan chains from the circuit described in RTL codes.

The present invention further comprises any software using a CAD system to extract scan chains from scanned IP cores described in RTL codes, based on user-specified scan data input and output pins.

(9) Interactive Scan Debug at RTL

It is possible that during scan extraction or after scan replacement and scan stitching, the scan chains are still broken. It is important that such broken scan chains and scan instances shall be identified and repaired.

The present invention further comprises any software using a CAD system to allow the designer to interactively trace, either forwards or backwards, any scan chain and display signal values. Whenever any error is found, interactive commands, such as force 0 or 1, can be used to allow the designer to change internal signal values so that the designer can proceed further until all problems related to broken scan chains are identified and fixed. To aid in debugging, the present invention further comprises any software using a CAD system to display the RTL codes being traced and highlight the values on its corresponding schematics.

(10) Interactive Scan Repair at RTL

The present invention further comprises any software using a CAD system to allow the designer to conduct interactive scan repair. As long as any broken chains are identified and fixed during interactive scan debug, these fixes must be reflected on the RTL codes by modifying the original RTL codes by hand or by software.

(11) Test Bench Generation at RTL

Upon successful verification of scan chains, an integrated circuit now becomes testable. The designer can now verify the scanned integrated circuit with his/her own test benches created or use the flush and random test benches created by the CAD system.

The present invention further comprises any software using a CAD system to allow a designer to generate flush or random test benches based upon the extracted scan chains on scanned RTL codes.

(12) Hierarchical Scan Synthesis and Test Bench Generation at RTL

A large and complex integrated circuit usually contains many large modules or IP cores. To reduce scan synthesis time, one can first do scan synthesis on a module-by-module basis, and then stitch them together at top-level.

The present invention further comprises any software using a CAD system to allow the designer to do scan synthesis, comprising stages described from (1) through (12), on a module-by-module basis, stitch them together at top-level, and generate the required top-level flush or random test benches.

BRIEF DESCRIPTION OF THE DRAWINGS

The above and other objects, advantages and features of the invention will become more apparent when considered with the following specification and accompanying drawings wherein:

FIG. 3 shows an example report generated by testability analysis at RTL in accordance with the present invention;

FIG. 7 shows an example set of scan constraints for scan selection and test point selection in accordance with the present invention;

FIGS. 8A-8F show an example set of RTL Verilog codes and circuit models before and after scan repair of various asynchronous set/reset violations in accordance with the present invention;

FIGS. 9A-9C show an example set of RTL Verilog codes and circuit models before and after scan repair of various clock violations in accordance with the present invention;

FIGS. 10A-10C show an example set of RTL Verilog codes and circuit models before and after scan repair of a connection from clock to input violation in accordance with the present invention;

FIGS. 11A-11C show an example set of RTL Verilog codes and circuit models before and after a latch is made transparent in accordance with the present invention;

FIGS. 12A-12C show an example set of RTL Verilog codes and circuit models before and after scan repair of a bi-directional pin in accordance with the present invention;

FIGS. 13A-13C show an example set of RTL Verilog codes and circuit models before and after scan repair of a combinational feedback loop in accordance with the present invention;

FIGS. 14A-14C show an example set of RTL Verilog codes and circuit models before and after scan repair of a pulse generator violation in accordance with the present invention;

FIGS. 15A-15C show an example set of RTL Verilog codes and circuit models before and after scan repair of a tri-state bus violation in accordance with the present invention;

FIGS. 16A-16E show an example set of RTL Verilog codes and circuit models before and after control point insertion in accordance with the present invention;

FIGS. 17A-17F show an example set of RTL Verilog codes and circuit models before and after observation point insertion in accordance with the present invention;

FIG. 18 shows an example set of RTL Verilog codes before and after scan replacement and scan stitching in accordance with the present invention;

FIG. 19 shows a plurality of scan extraction commands and an example on how to perform scan extraction in accordance with the present invention;

FIG. 20 shows a plurality of interactive scan debug commands and an example on how to perform interactive scan debug in accordance with the present invention;

FIG. 21 shows a plurality of interactive scan repair commands and an example on how to perform interactive scan repair in accordance with the present invention;

FIG. 22 shows an example syntax of input information for generating HDL (hardware description language) test benches in accordance with the present invention;

DETAILED DESCRIPTION OF THE INVENTION

The following description is presently contemplated as the best mode of carrying out the present invention. This description is not to be taken in a limiting sense but is made merely for the purpose of describing the principles of the invention. The scope of the invention should be determined by referring to the appended claims.

FIG. 1 shows an example integrated circuit design before scan synthesis and its corresponding scan-based integrated circuit design after scan synthesis in accordance with the present invention.

Figure 1A:
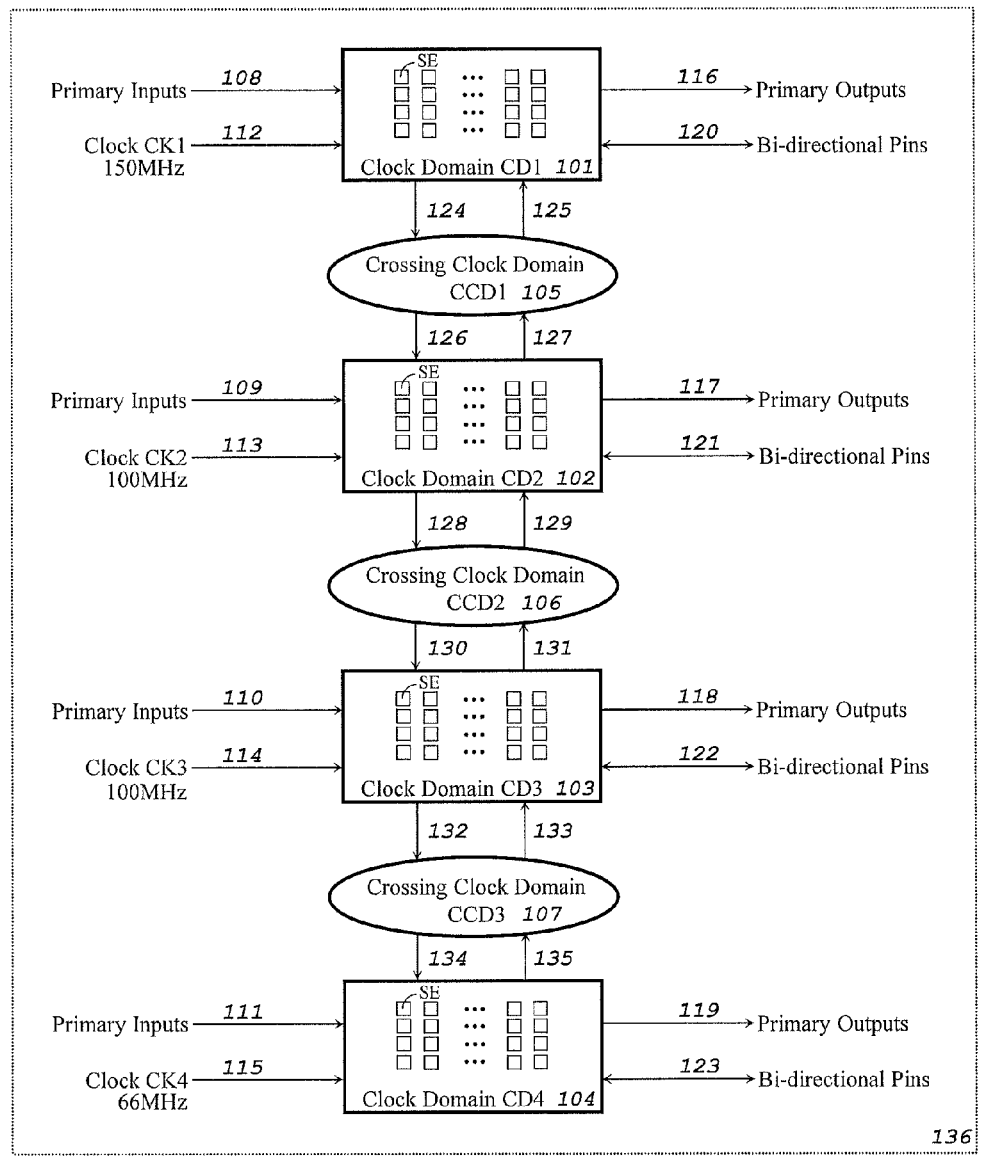
FIGS. 1A-1B show an example integrated circuit design before scan synthesis and its corresponding scan-based integrated circuit design after scan synthesis in accordance with the present invention.

FIG. 1A shows a typical integrated circuit design before scan synthesis is performed. The design 136 has 4 clock domains CD1 101 to CD4 104, 3 crossing clock-domain logic blocks CCD1 105 to CCD3 107, primary inputs 108 to 111, primary outputs 116 to 119, and bi-directional pins 120 to 123. In addition, it has 4 system clocks CK1 112 to CK4 115, running at 3 different frequencies. Furthermore, storage elements (SE) exist in each clock domain.

Figure 1B:
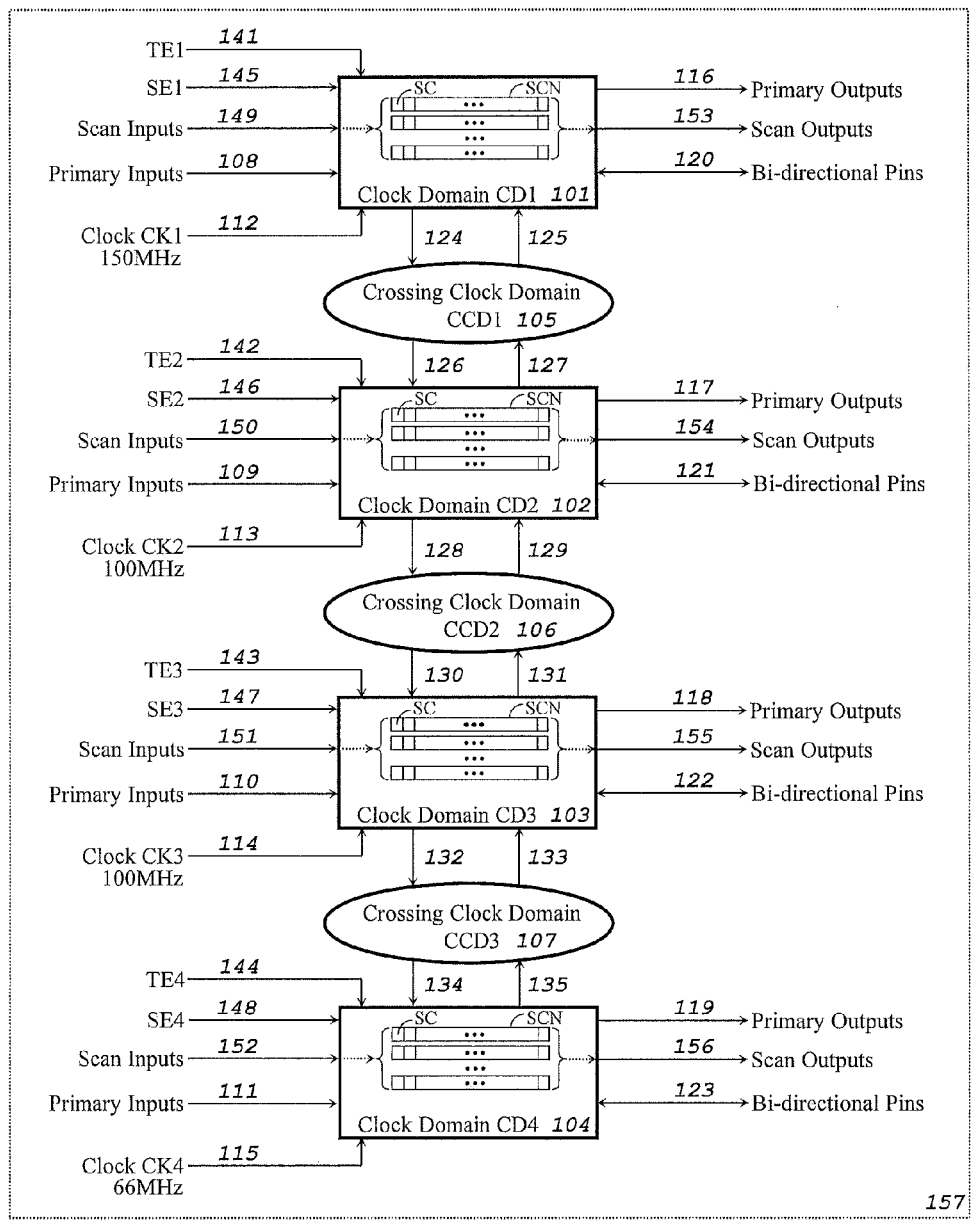

FIG. 1B shows the resulting design 157 after scan synthesis is performed on the integrated circuit design 136 shown in FIG. 1A. After scan synthesis, all or part of original storage elements (SE) are replaced with scan cells (SC). In addition, the scan cells are stitched into one or a plurality of scan chains (SCN), which can be accessed by scan inputs 149 to 152 and scan outputs 153 to 156. A scan cell can accept data either from its corresponding functional logic, or from its previous scan cell in the scan chain or a scan input, depending on the values of scan enable signals SE1 145 to SE4 148. These scan enable signals, together with test enable signals TE1 141 to TE4 144, are also used to fix scan design rule violations.

A scan-based integrated circuit, such as the one shown in FIG. 1B, is tested by repeating three operations: shift, capture, and comparison or compaction, as described bellow:

During the shift operation or in a shift cycle, pseudorandom or predetermined stimuli will be shifted through scan inputs 149 to 152 to all scan cells SC in all scan chains SCN within the 4 clock domains, CD1 101 to CD4 104, simultaneously. After the shift operation or a shift cycle is completed, capture clocks are applied to all clock domains, CD1 101 to CD4 104, to capture circuit responses into scan cells. After the capture operation or a capture cycle is completed, the circuit responses captured into all scan cells SC are shifted out through scan outputs 153 to 156 for direct comparison during the comparison operation or for compaction during the compaction operation. In order to determine if the circuit 157 is faulty or not, the comparison operation compares captured circuit responses with expected circuit responses after each stimulus is applied; while the compaction operation compresses captured circuit responses into a signature repeatedly after each stimulus is applied. The signature is only compared with the expected signature once all stimuli have been applied.

Figure 2:
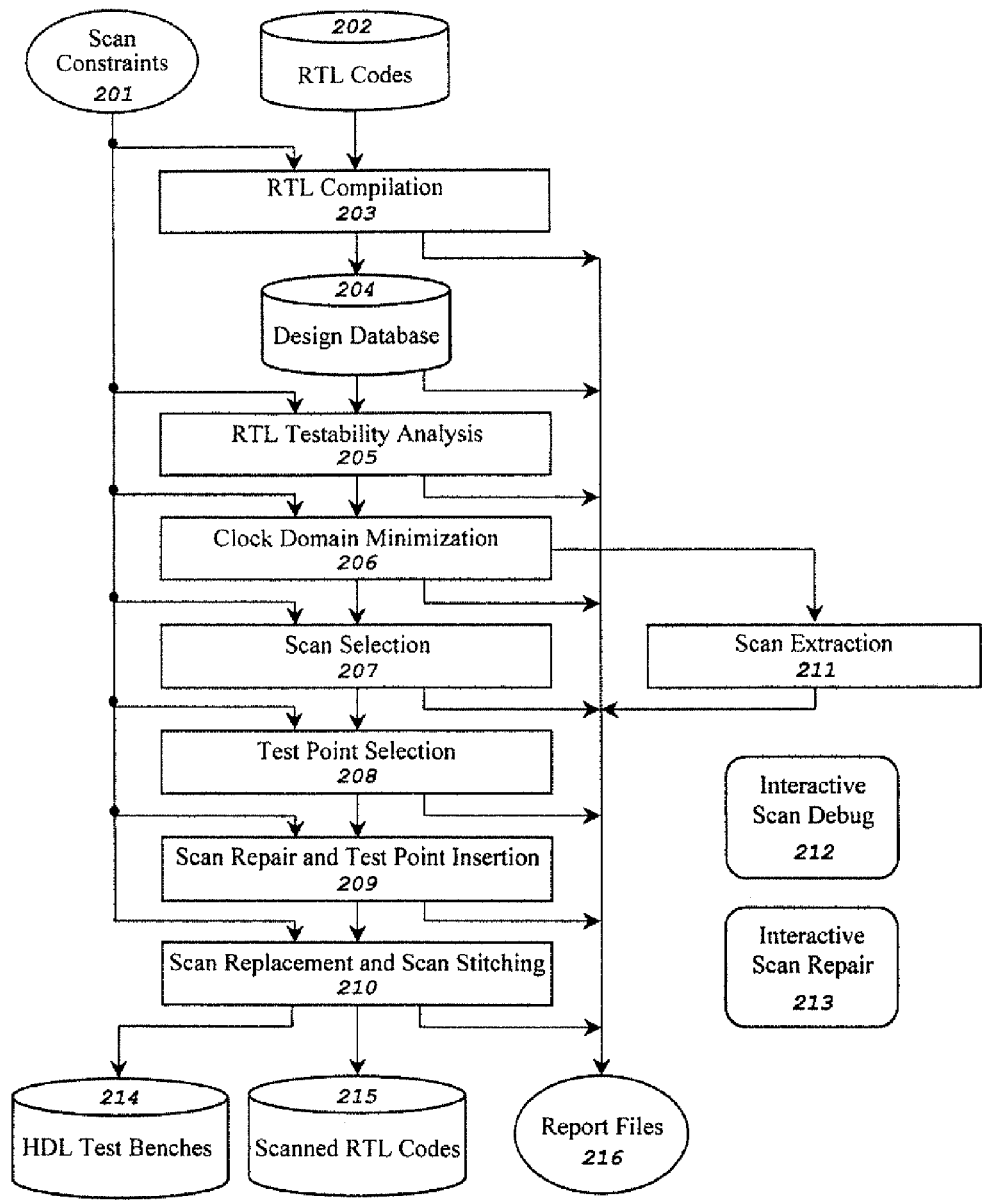
FIG. 2 shows a block diagram of a computer-aided design (CAD) system for scan synthesis at RTL in accordance with the present invention.

FIG. 2 shows a block diagram of a computer-aided design (CAD) system for scan synthesis at RTL, of one embodiment of the present invention. The RTL scan synthesis CAD system 200 accepts the user-supplied synthesizable RTL codes 202 and the scan constraints 201. The scan constraints 201 contain all set-up information and scripts required for compiling 203 the RTL codes 202 into a design database 204, based on which RTL testability analysis 205, clock-domain minimization 206, scan selection 207, test point selection 208, scan repair and test point insertion 209, scan replacement and scan stitching 210, scan extraction 211, interactive scan debug 212, and interactive scan repair 213 are performed. The CAD system then produces final scanned RTL codes 215 as well as HDL (hardware description language) test benches 214. All reports and errors are stored in report files 216.

FIG. 3 shows an example report generated by testability analysis at RTL in accordance with the present invention. The report 300 consists of two parts: Circuit Statistics and Testability Analysis Summary. Circuit Statistics reports such information as the numbers of primary input pins, primary output pins, bi-directional pins, accessible nets, accessible flip-flops, accessible latches, accessible register files, accessible memory elements, inaccessible flip-flops, inaccessible latches, inaccessible register files, and inaccessible memory elements in the circuit under analysis. Testability Analysis Summary reports the numbers of various types of scan design rule violations found during RTL testability analysis, including floating primary input ports, floating primary output ports, floating bi-directional ports, objects with floating inputs, objects with floating outputs, floating nets, sequential gated set/reset, combinational gated set/reset, generated set/reset, destructive set/reset, generated clocks, sequential gated clocks, combinational gated clocks, constant clocks, connections from clocks to data inputs, transparent latches, unfixed bi-directional pins, combinational feedback loops, potential combinational feedback loops, pulse generators, potential bus contentions, and crossing clock domains. In addition, detailed information on the identified scan design rule violations, including module names, and locations, is also included in the report.

Figure 4:
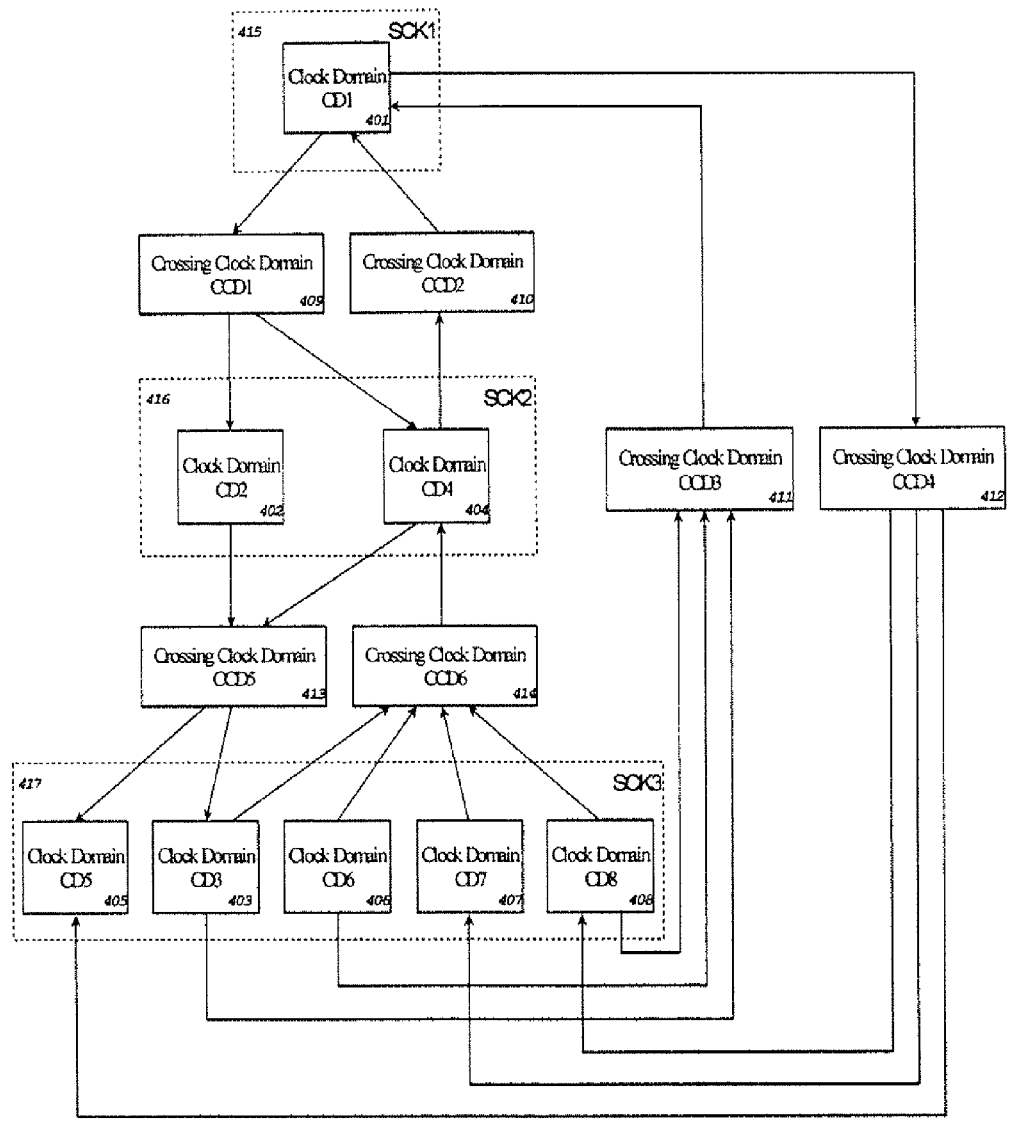
FIG. 4 shows an example of clock domain minimization on a 8 clock-domain design in accordance with the present invention, where 3 scan clocks are used to test the 8 clock domains operated at single-frequency or slow-speed.

FIG. 4 shows an example of reducing test generation cost and test application cost for a design containing 8 clock domains, of one embodiment of the present invention at single-frequency or slow-speed. The design 400 has 8 clock domains, CD1 401 to CD8 408, which is controlled by 8 clocks, CK1 to CK8 (not shown in FIG. 4) respectively. For the purpose of clock domain minimization, the clock information is specified in scan constraints in the following ASCII format:

```
%TA_CONSTRAINTS
{
    %CLOCK CK1 = '010000000000000000000000';
    %CLOCK CK2 = '000010000000000000000000';
    %CLOCK CK3 = '000000010000000000000000';
    %CLOCK CK4 = '000000000010000000000000';
    %CLOCK CK5 = '000000000000010000000000';
    %CLOCK CK6 = '000000000000000010000000';
    %CLOCK CK7 = '000000000000000000010000';
    %CLOCK CK8 = '000000000000000000000010';
}
```

In the above specification, each clock is given a different phase. As a result, a total of 24 clock phases are used. Clock-domain minimization is performed to minimize the number of clocks needed for test in order to reduce test generation cost and test application cost. Note that, through testability analysis at RTL, the information on how clock domains interact with each other is obtained. Based on this information, clock-domain minimization will be performed by merging clock domains that do not interact with each other. In the design 400, since CD1 401 interacts with all other clock domains, it cannot be merged with any other clock domain. Clock domains CD2 402 and CD4 404 do not interact each other and thus can be merged. Since CD3 403, CD5 405, CD6 406, CD7 407, and CD8 408 do not interact each other, they can also be merged. As a result, the design 400 can be tested using only 3 scan clocks, SCK1 415 to SCK3 417. The capture sequences of the 3 scan clocks in one-hot mode, non-overlapping mode, and overlapping mode, are given below:

```
%CAPTURE_SEQUENCE // In one-hot mode
{
    %CLOCK SCK1 = '010';
    %CLOCK SCK2 = '010';
    %CLOCK SCK3 = '010';
}
%CAPTURE_SEQUENCE // In non-overlapping mode
{
    %CLOCK SCK1 = '010000000';
    %CLOCK SCK2 = '000010000';
    %CLOCK SCK3 = '000000010';
}
```

```
%CAPTURE_SEQUENCE // In overlapping mode
{
    %CLOCK SCK1 = '0111000';
    %CLOCK SCK2 = '0011100';
    %CLOCK SCK3 = '0001110';
}
```

Here, SCK1={CK1}, SCK2={CK2, CK4}, and SCK3={CK3, CK5, CK6, CK7, CK8}. SCK2={CK2, CK4}, for example, means that scan clock SCK2 416 is wired to both clocks CK2 and CK4 to test clock domains CD2 402 and CD4 404, simultaneously. In overlapping mode, for example, 7 clock phases are used instead of 24 clock phases.

Figure 5:
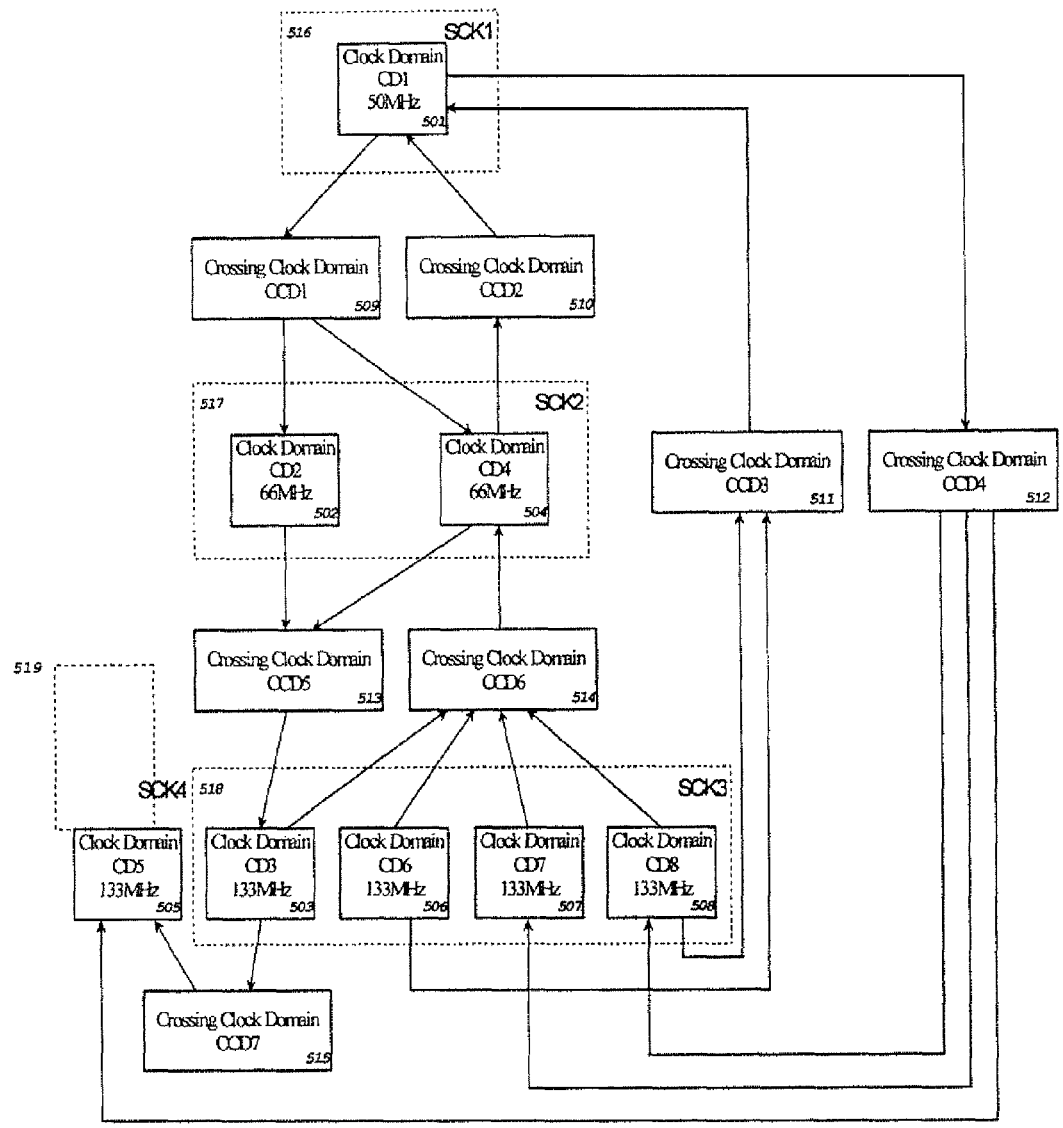
FIG. 5 shows an example of clock domain minimization on a 8 clock-domain design in accordance with the present invention, where 4 scan clocks are used to test the 8 clock domains operated at multiple-frequency or at-speed.

FIG. 5 shows an example of reducing test generation cost and test application cost for a design containing 8 clock domains, of one embodiment of the present invention at multiple-frequency or at-speed. The design 500 has 8 clock domains, CD1 501 to CD8 508, which is controlled by 8 clocks, CK1 to CK8 (not shown in FIG. 5) respectively. Clock domain CD1 501 is operated at 50 MHz, clock domains CD2 502 and CD4 504 are operated at 66 MHz, all other clock domains are operated at 133 MHz. For the purpose of clock domain minimization, the clock information is specified in scan constraints in the following ASCII format:

```
%TA_CONSTRAINTS
{
    %CLOCK CK1 = '010000000000000000000000';
    %CLOCK CK2 = '000010000000000000000000';
    %CLOCK CK3 = '000000010000000000000000';
    %CLOCK CK4 = '000000000010000000000000';
    %CLOCK CK5 = '000000000000010000000000';
    %CLOCK CK6 = '000000000000000010000000';
    %CLOCK CK7 = '000000000000000000010000';
    %CLOCK CK8 = '000000000000000000000010';
}
```

During clock-domain minimization, clock domains with the same frequency are analyzed at the same time. Since CD1 501 is the only clock domain that operates at 50 MHz, it must be tested independently with a scan clock SCK1 516. Since CD2 502 and CD4 504 are operated at the same frequency of 66 MHz and they do not interact with each other, their corresponding clocks CK2 and CK4 can be merged into one scan clock SCK2 517. Since CD3 503, CD6 506, CD7 507, and CD8 508 are operated at 133 MHz and they do not interact each other, their corresponding clocks CK3, CK6, CK7, and CK8 can be merged into one scan clock SCK3 518. However, since CD5 505, though operated at the same frequency as CD3, CD6, CD7, and CD8, interacts with CD3 503, CD5 505 should be tested independently with a scan clock SCK4 519. As a result, the design 500 can be tested using only 4 scan clocks SCK1 516 to SCK4 519. The capture sequences of the 4 scan clocks in one-hot mode and non-overlapping mode are given below:

```
%CAPTURE_SEQUENCE // In one-hot mode
{
    %CLOCK SCK1 = '010';
    %CLOCK SCK2 = '010';
    %CLOCK SCK3 = '010';
    %CLOCK SCK4 = '010';
}
%CAPTURE_SEQUENCE // In non-overlapping mode
{
    %CLOCK SCK1 = '0100000';
```

```
%CLOCK SCK2 = '0001000';
%CLOCK SCK3 = '0000010';
%CLOCK SCK4 = '0001000';
}
```

Here, SCK1={CK1}, SCK2={CK2, CK4}, SCK3={CK3, CK6, CK7, CK8}, and SCK4={CK5}. SCK2={CK2, CK4}, for example, means that scan clock SCK2 517 is wired to both clocks CK2 and CK4 to test clock domains CD2 502 and CD4 504, simultaneously. In the non-overlapping mode, for example, only 7 clock phases instead of 24 clock phases are used. SCK2 517 and SCK4 519 can operate concurrently but at different frequencies. This is because the clock domains, CD2 502 and CD4 504, driven by SCK2 517, and the clock domain CD5 505 driven by SCK4 519 do not interact with each other.

Figure 6:
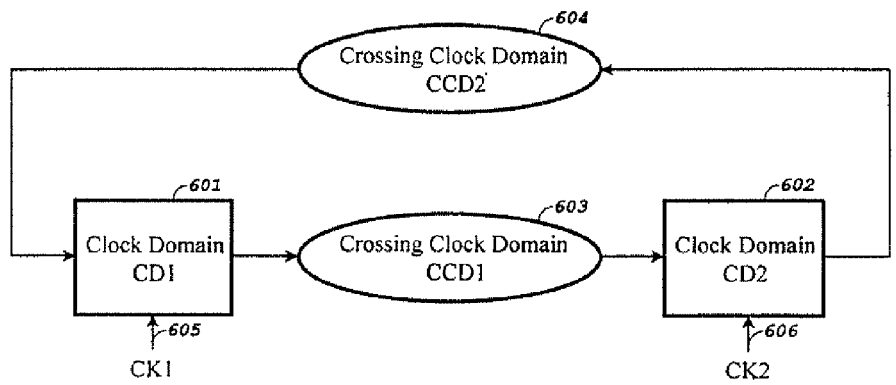
FIG. 6 shows an example design with 2 clock domains driven by 2 scan clocks in accordance with the present invention, where an optimal order for applying a sequence of the 2 scan clocks to the 2 clock domains in a capture cycle is identified in order to minimize the memory usage in transforming an integrated circuit for fault simulation or ATPG (automatic test pattern generation)

FIG. 6 shows an example design with 2 clock domains driven by 2 scan clocks in accordance with the present invention, where an optimal order for applying a sequence of the 2 scan clocks to the 2 clock domains in a capture cycle is identified in order to minimize the memory usage in transforming an integrated circuit for fault simulation or ATPG (automatic test pattern generation).

As shown in FIG. 6, clock domains CD1 601 and CD2 602 are driven by scan clocks CK1 605 and CK2 606, respectively. In addition, there is a unidirectional crossing clock domain logic block CCD1 603 from CD1 601 to CD2 602, and there is a unidirectional crossing clock domain logic block CCD2 604 from CD2 602 to CD1 601. Assume that, the memory sizes needed to store the design databases of CD1 601, CD2 602, CCD1 603, and CCD2 604, measured by analyzing the corresponding RTL codes through fast-synthesis or estimation, are denoted by S(CD1), S(CD2), S(CCD1), and S(CCD2), respectively. Note that such a size should reflect the size of the gate-level netlist once the corresponding RTL codes are synthesized. In addition, assume that a single capture clock pulse is applied to each scan clock in a capture cycle.

First, consider the capture order of CK1 605 to CK2 606. When CK1 605 captures, S(CD1)+S(CCD2) of memory is needed for circuit transformation; then, when CK2 606 captures, S(CD1)+S(CD2)+S(CCD1)+S(CCD2) of memory is needed for circuit transformation since values in clock domain CD1 601 have already changed because the capture operation is first conducted in CK1 605. That is, the total memory usage for this scan clock order is proportional to A=2*S (CD1)+S(CCD1)+S(CD2)+2*S(CCD2).

Second, consider the capture order of CK2 606 to CK1 605. When CK2 606 captures, S(CCD1)+S(CD2) of memory is needed for circuit transformation since values in clock domain CD1 601 have not changed yet; then, when CK1 605 captures, S(CD1)+S(CD2)+S(CCD1)+S(CCD2) of memory is needed for circuit transformation. That is, the total memory usage for this scan clock order is proportional to B=S(CD1)+2*S(CCD1)+2*S(CD2)+S(CCD2).

The difference in memory usage is A−B=(S(CD1)+S(CCD2))−(S(CD2)+S(CCD1)). Obviously, depending on the sizes of clock domains CD1 601 and CD2 602 as well as crossing clock domains CCD1 603 and CCD2 604, one can identify the optimal order for scan clocks CK1 605 and CK2 606.

FIG. 7 shows an example set of scan constraints for RTL scan selection and test point selection in accordance with the present invention.

As shown from line 3 to line 14, the user-specified scan constraints 700 indicate what modules shall be included or excluded from RTL scan insertion, how many scan chains are allowed, how many scan cells are allowed for each scan chain, whether it is required to balance all scan chains, and what cell depth is allowed for a feed-forward partial-scan design, etc. If no cell depth is specified, a full-scan design, of cell-depth 0, will be automatically assumed. Based on such constraints, RTL codes are analyzed and a set of scan instance files are generated, each containing a set of storage elements to be formed into one scan chain.

Scan selection starts by analyzing the design database and selecting storage elements within each clock domain that are directly controllable by a scan clock. When a selected storage element cannot be directly controllable by a scan clock, it can be repaired when so required. The selected storage cells are put into groups according to user-specified scan constraints, i.e. the maximum scan chain length, the number of scan chains, etc. When scan balancing is required, scan cells from different clock domains may be merged or split. In this case, it is necessary to perform scan ordering for scan cells within all clock domains to reduce clock skews and routing difficulties.

As shown from line 15 to line 28, the user-specified scan constraints 700 also indicate where to insert control points, including AND-control points, OR-control points, MUX-control points, and XOR-control points, as well as observation points, including normal observation points and XOR-observation points. Information on where to insert scan points is also specified in scan constraints 700.

FIG. 8 shows an example set of RTL Verilog codes and circuit models before and after scan repair of various asynchronous set/reset violations in accordance with the present invention.

In any scan-based DFT (design-for-test) technique, all asynchronous set/reset signals must be disabled in a shift cycle since they may destroy the values that are being shifted into scan chains. When an asynchronous set/reset signal is not driven directly by a primary input, it is hard to control the asynchronous set/reset signal during test. This is a scan design rule violation. Generally, there are four types of asynchronous set/reset violations: sequential gated set/reset, combinational gated set/reset, generated set/reset, and destructive set/reset. In a sequential gated set/reset violation, the set/reset signal can be traced back to a specified set/reset source gated with the output of a storage element such as a flip-flop or a latch. In a combinational gated set/reset violation, the set/reset signal can be traced back to a specified set/reset source gated with a primary input or the output of a combinational logic block. In a generated set/reset violation, the set/reset signal cannot be traced back to any primary input specified as a set/reset source. In a destructive set/reset violation, the set/reset signal is stuck at a certain logic value that sets or resets the storage element constantly. A scan enable signal, SE, is used for repairing such an asynchronous set/reset rule violation. The SE signal is set to logic value 1 in a shift cycle and is set to logic value 0 in a capture cycle or a functional cycle.

FIG. 8A shows an example set of RTL Verilog codes before and after scan repair of a sequential gated set/reset rule violation and a combinational gated set/reset rule violation in accordance with the present invention. In the original RTL Verilog codes, the asynchronous set/reset signal s_rst on line 11, of the inferred D flip-flop q1, can be traced back to the output of a D flip-flop z on line 8. Note that z is gated with the specified set/reset source signal rst on line 5. Obviously, this is a sequential gated set/reset violation. In addition, the asynchronous set/reset signal c_rst on line 18, of the inferred D flip-flop q2, can be traced back to the primary input x on line 6. Note that x is gated with the specified set/reset source rst on line 6. Obviously, this is a combinational gated set/reset violation. In the modified RTL Verilog codes, two new signals, scan_s_rst and scan_c_rst, are added to model the repaired s_rst and c_rst signals, respectively. The continuous assignment statements on lines 9 and 11 model the added scan logic that repairs the sequential gated set/reset violation and the combinational gated set/reset violation, respectively. In the modified RTL codes, SE on lines 9 and 11 is a scan enable signal. When SE has logic value 0, the RTL circuit behavior is the same as the original one; when SE has logic value 1, the signal scan_s_rst and scan_c_rst will become logic value 0, disabling the asynchronous set/reset operation of the D flip-flops inferred for signals q1 and q2 in the always blocks on lines 19 and 26, respectively.

FIG. 8B shows an example set of RTL Verilog codes before and after scan repair of a generated set/reset rule violation and a destructive set/reset rule violation in accordance with the present invention. In the original RTL Verilog codes, the asynchronous set/reset signal g_rst on line 10, of the inferred D flip-flop q1, can be traced back to the output of a D-flip flop on line 6. Obviously, this is a generated set/reset violation. The asynchronous set/reset signal d_rst on line 17, of the inferred D flip-flop q2, is always stuck at logic value 1. Obviously, this is a destructive set/reset violation because the D flip-flop q2 will always be reset. In the modified RTL Verilog codes, two new signals, scan_g_rst and scan_d_rst, are added to model the repaired g_rst and d_rst signals, respectively. The continuous assignment statements on lines 9 and 11 model the added scan logic that repairs the generated set/reset violation and the destructive set/reset violation, respectively. In the modified RTL codes, SE on lines 9 and 11 is a scan enable signal. When SE has logic value 0, the RTL circuit behavior is the same as the original one; when SE has logic value 1, the signal scan_g_rst and scan_d_rst will become logic value 0, disabling the asynchronous set/reset operation of the D flip-flops inferred for signals q1 and q2 in the always block on lines 19 and 26, respectively.

Figure 8C:
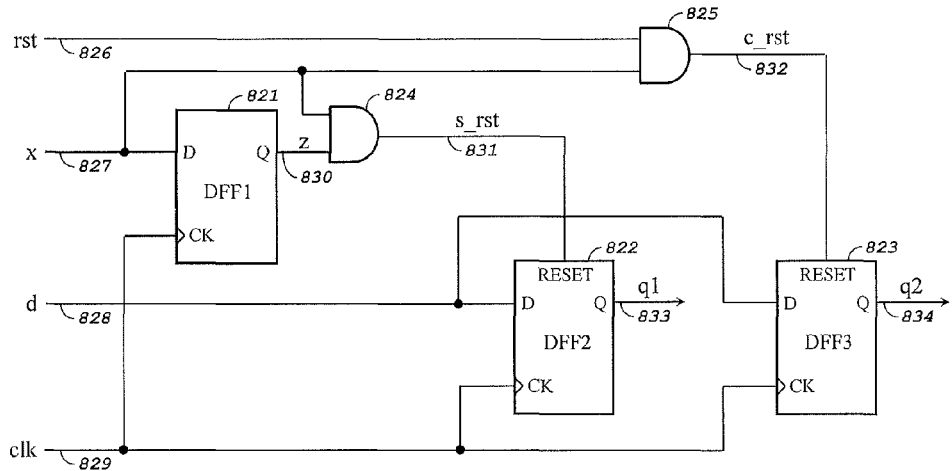

FIG. 8C shows the circuit model corresponding to the original RTL codes in FIG. 8A. D flip-flops DFF2 822 and DFF3 823 are reset by asynchronous signals s_rst 831 and c_rst 832, respectively. Since the value of s_rst 831 is determined by an AND gate 824 with the output z 830 of D flip-flop DFF1 821 as one of its inputs, this is a sequential gated set/reset rule violation. Since the value of c_rst 832 is determined by an AND gate 825 with only primary inputs rst 826 and x 827 as its inputs, this is a combinational gated set/reset rule violation.

Figure 8D:
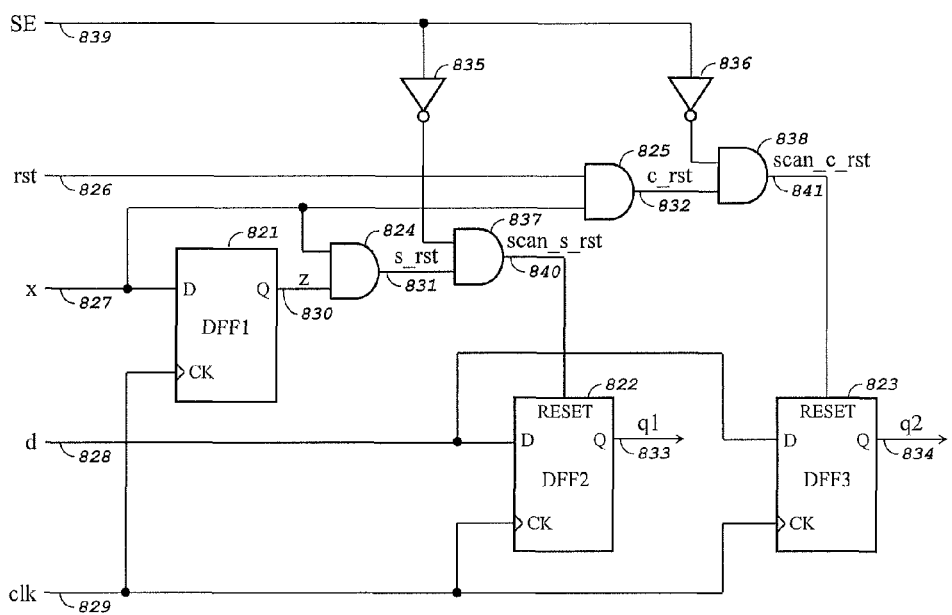

FIG. 8D shows the circuit model after scan repair of the sequential gated set/reset violation and the combinational gated set/reset violation shown in FIG. 8C. Here, two AND gates 837 and 838 as well as two inverters 835 and 836 are added to disable the reset operations of DFF2 822 and DFF3 823 only in a shift cycle via the scan enable signal SE 839. When SE 839 has logic value 0, s_rst 831 and c_rst 832 will be used to reset DFF2 822 and DFF3 823. respectively; when SE 839 has logic value 1, scan_s_rst 840 and scan_c_rst 841 will become logic value 0, preventing DFF2 822 and DFF3 823 from being reset in a shift cycle, respectively.

Figure 8E:
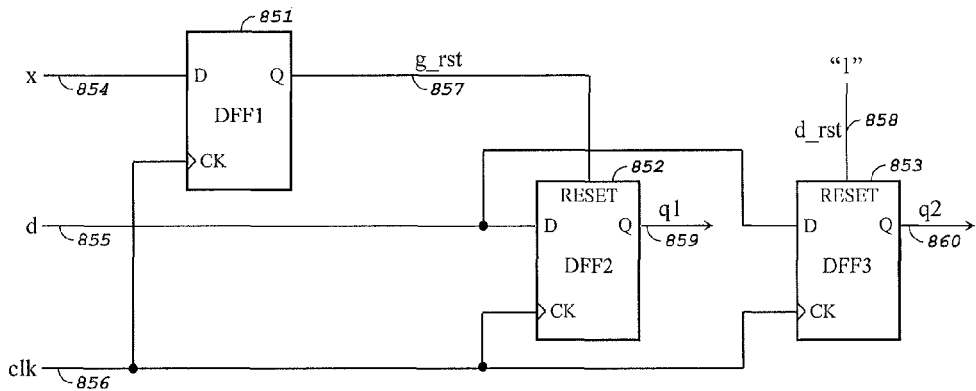

FIG. 8E shows the circuit model corresponding to the original RTL codes in FIG. 8B. D flip-flops DFF2 852 and DFF3 853 are reset by asynchronous signals g_rst 857 and d_rst 858, respectively. Since g_rst 857 comes directly from a D flip-flop DFF1 851, this is a generated set/reset rule violation. Since the reset port of DFF3 853 is stuck at logic value 1, this is a destructive set/reset rule violation.

Figure 8F:
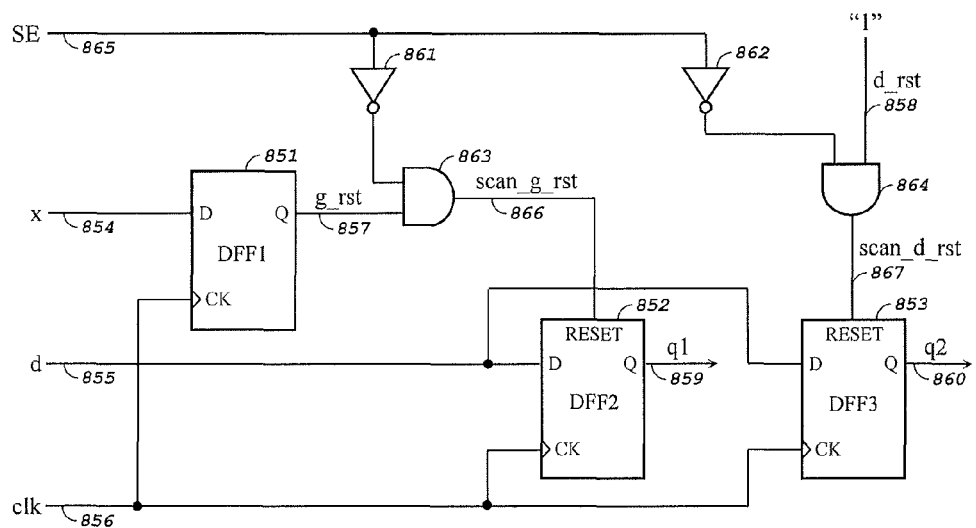

FIG. 8F shows the circuit model after scan repair of the generated set/reset violation and the destructive set/reset violation shown in FIG. 8E. Here, two AND gates 863 and 864 as well as two inverters 861 and 862 are added to disable the reset operations of DFF2 852 and DFF3 853 only in a shift cycle via the scan enable signal SE 865. When SE 865 has logic value 0, g_rst 857 and d_rst 858 will be used to reset DFF2 852 and DFF3 853, respectively; when SE 865 has logic value 1, scan_s_rst 866 and scan_c_rst 867 will become logic value 0, preventing DFF2 852 and DFF3 853 from being reset in a shift cycle, respectively.

FIG. 9 shows an example set of RTL Verilog codes and circuit models before and after scan repair of various clock violations in accordance with the present invention.

Generally, in any scan-based DFT (design-for-test) technique, the clock signals of all scan cells must be directly controlled by a designated test clock. When a clock signal is not driven directly by a primary input specified as a test clock source, it is hard to control the clock during test. This is a scan design rule violation. There are four types of clock violations: generated clock, combinational gated clock, sequential gated clock, and constant clock. In a generated clock violation, the clock signal cannot be traced back to a primary input specified as a test clock source. In a combinational gated clock violation, the clock signal can be traced back to a specified test clock source gated with a primary input or the output of a combinational logic block. In a sequential gated clock violation, the clock signal can be traced back to a specified test clock source gated with the output of a storage element such as a flip-flop or a latch. In a constant clock violation, the clock signal is stuck at a certain logic value and breaks the corresponding scan chain.

FIG. 9A shows an example set of RTL Verilog codes before and after scan repair of various clock violations in accordance with the present invention. As shown in FIG. 9A, in the original RTL Verilog codes, the clock signal g_clk on line 8, of the inferred D flip-flop q1, is the output of a D flip-flop on line 4. This is a generated clock violation. The clock signal c_clk on line 15, of the inferred D flip-flop q2, can be traced back to the specified clock source clk, gated with the signal clk_en. This is a combinational gated clock violation. The clock signal const_clk on line 19, of the inferred D flip-flop q3, is always stuck at logic value 0. This is a constant clock violation since the D flip-flop q3 can never be triggered. In the modified RTL Verilog codes, a test enable signal, TE, and a scan enable signal, SE, are added in order to repair various clock violations. test_g_clk is added on line 7 to model the repaired clock signal to fix the generated clock violation during test. test_c_clk is added on line 10 to model the repaired clock signal to fix the combinational gated clock violation or any sequential gated clock violation in a shift cycle. test_const_clock is added on line 12 to model the repaired clock signal to fix the constant clock violation during test.

Figure 9B:
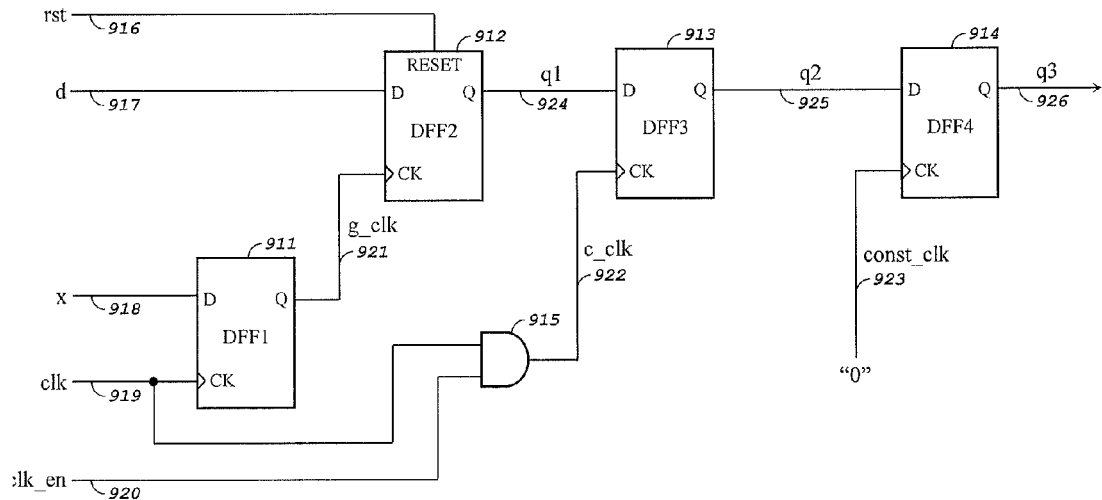

FIG. 9B shows the circuit model corresponding to the original RTL codes in FIG. 9A. The D flip-flops DFF2 912, DFF3 913, and DFF4 914 are driven by clock signals g_clk 921, c_clk 922, and const_clk 923, respectively. The clock signal g_clk 921 is the output of the D flip-flop DFF1 911; hence, this is a generated clock violation. The clock signal c_clk 922 is driven by the output of an AND gate 915, and is directly traced back to a designated clock source clk 919 and a primary input clk_en 920; hence, this is a combinational gated clock violation. Clock signal const_clock 923 is stuck at logic value 0; hence this is a constant clock violation.

Figure 9C:
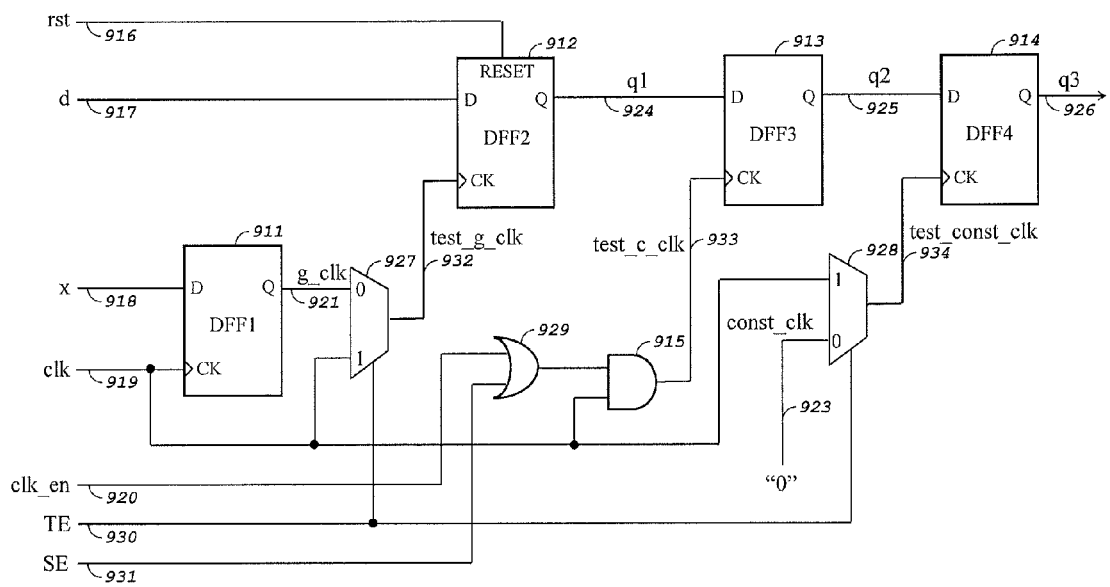

FIG. 9C shows the circuit model after scan repair of the generated, combinational gated and constant clock violations. Two multiplexers 927 and 928 as well as one OR gate 929 are added to repair the above violations. When the test enable signal TE 930 is set to logic value 1 during test, the multiplexer 927 will select the designated test clock signal clk 919 as the clock of DFF2 912. The output of the OR gate 929 will be forced to logic value 1 in a shift cycle by the scan enable signal SE 931. This will allow DFF3 913 to be controlled directly by the designated test clock signal clk 919. The multiplexer 928 will also select the designated test clock signal clk 919 as the clock for DFF4 914 during test. After scan repair, the D flop-flops DFF2 912, DFF3 913, and DFF4 914 are all directly controlled by the designated test clock clk 919. Note that a sequential gated clock can be repaired in the same way as a combinational gated clock.

FIG. 10 shows an example set of RTL Verilog codes and circuit models before and after scan repair of a connection from clock to input violation in accordance with the present invention.

In any scan-based DFT (design-for-test) technique, a clock signal should not be connected to the data input of any storage element. Such a violation may create race condition in a capture cycle. The captured data in a capture cycle becomes unknown since it depends on the delay of the paths from the test clock to the clock input and the data input of the storage element. All paths from the clock to the data input of a scan cell must be broken during test.

FIG. 10A shows an example set of RTL Verilog codes before and after scan repair of a connection from clock to input violation in accordance with the present invention. In the original RTL Verilog codes, the clock signal clk is connected to the data input of the inferred flip-flip q via a combinational logic block as shown on line 1. In the modified RTL Verilog codes, a test enable signal TE is added on line 5, based on which a new signal test_clk_to_d on line 5 is added to model a stable logic value to the data input of flip-flop q. The continuous assignment statement on line 8 models the added scan logic. When TE has logic value 1, test_clk_to_d is set to logic value 1. As a result, the data input of the D flip-flop q will have a stable and known value during test.

Figure 10B:
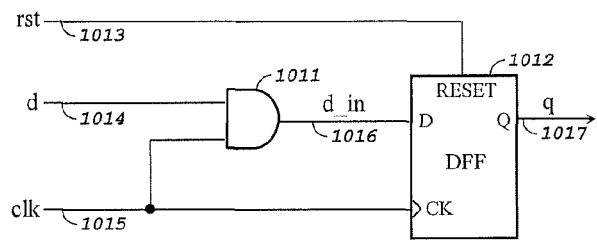

FIG. 10B shows the circuit model corresponding to the original RTL codes in FIG. 10A. There is a connection from the clock signal clk 1015 to the data input of the D flip-flop DFF 1012 through an AND gate 1011. This is a connection from clock to data input violation.

Figure 10C:
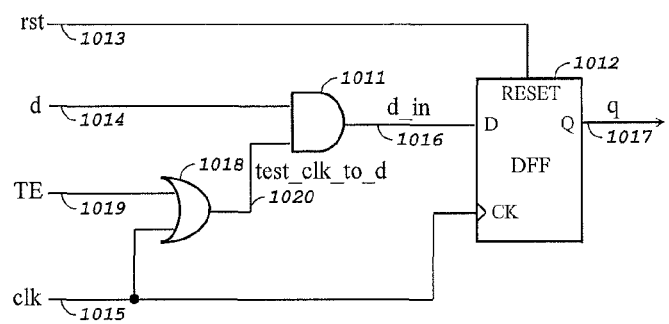

FIG. 10C shows the circuit model after scan repair of the connection from clock to data input violation. One OR gate 1018 is added to repair the violation. When the TE signal 1019 is set to logic value 1 during test, the path from the clock signal clk 1015 to the data input of DFF 1012 will be disabled.

FIG. 11 shows an example set of RTL Verilog codes and circuit models before and after a latch is made transparent in accordance with the present invention.

FIG. 11A shows an example set of RTL Verilog codes before and after a latch is made transparent in accordance with the present invention. In the original RTL Verilog codes, the latch is inferred from variables which are read before they are written in an always block. The enable signal of the latch is also inferred from the original RTL Verilog codes. In any scan-based DFT (design-for-test) technique, latches must be replaced with scan latches or made transparent in a shift cycle. In modified RTL codes, a test enable signal TE is added on line 5 to make the latch transparent during test. The modified RTL Verilog codes have the same behavior as the original RTL codes when TE has logic value 0. Most commercial logic synthesis tools also support the instantiation of technology independent latches at RTL. In this case, scan latch replacement or scan repair can also be performed on the technology independent latch instances.

Figure 11B:
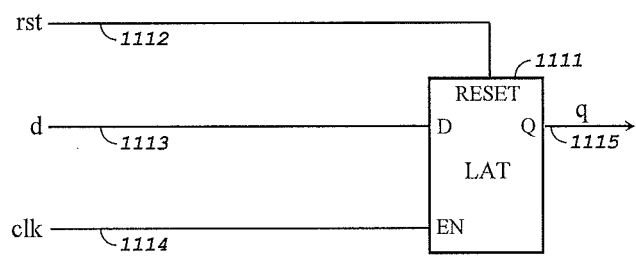

FIG. 11B shows the circuit model corresponding to the original RTL codes in FIG. 11A. The latch LAT 1111 must be made transparent during test.

Figure 11C:
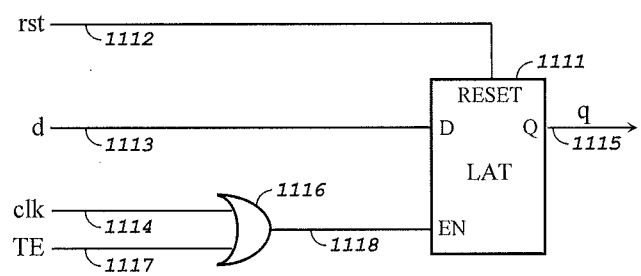

FIG. 11C shows the circuit model after scan repair is performed to make the latch transparent. One OR gate 1116 is added to make the enable signal of the latch LAT 1111 always active during test. When the test enable TE signal 1117 is set to logic value 1 during test, the output 1118 of the added OR gate 1116 will become logic value 1, activating the latch LAT 1111.

FIG. 12 shows an example set of RTL Verilog codes and circuit models before and after scan repair of a bi-directional pin in accordance with the present invention.

FIG. 12A shows an example set of RTL Verilog codes before and after fixing a bi-directional pin to input mode, in accordance with the present invention. As shown in the modified RTL codes, a scan enable signal, SE, is added on line 7 to fix the bi-directional pin to input mode. Generally, in a scan-based DFT (design-for-test) design, each bi-directional pin must be fixed to either input or output mode during test.

Figure 12B:
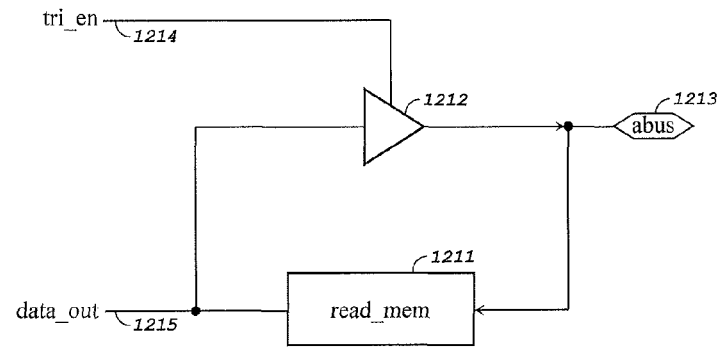

FIG. 12B shows circuit model corresponding to the original RTL codes shown in FIG. 12A. The direction of the bi-directional pin abus 1213 is controlled by the tri-state buffer 1212. In a shift cycle, the pin must be fixed to either input or output mode.

Figure 12C:
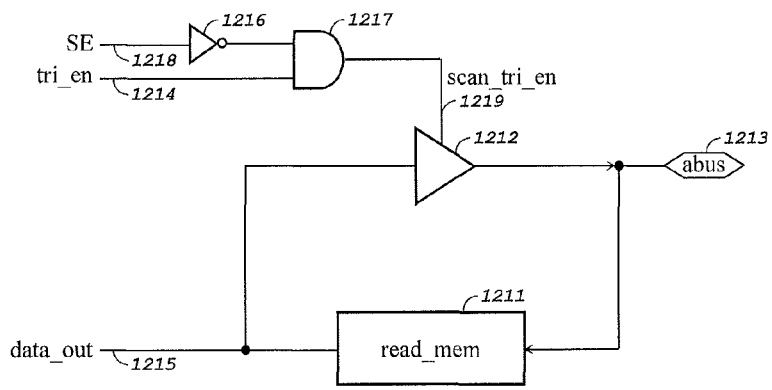

FIG. 12C shows the circuit model after fixing the bi-directional pin to input mode. One AND gate 1217 and one inverter 1216 are added to disable the tri-state buffer 1212 in a shift cycle. When the scan enable signal SE signal 1218 is set to logic value 1 in a shift cycle, the new tri-state buffer enable signal, scan_tri_en 1219, will become logic value 0. As a result, the tri-state buffer 1212 will be disabled, thus fixing the bi-directional pin abus 1213 to input mode.

FIG. 13 shows an example set of RTL Verilog codes and circuit models before and after scan repair of a combinational feedback loop or a potential combinational feedback loop in accordance with the present invention.

In any scan-based DFT (design-for-test) technique, combinational feedback loops must be avoided. Combinational feedback loops are usually caused by design errors. However, if the use of combinational feedback loops is required in the design, the combinational feedback loops must be broken during test. A potential combinational feedback loop is a false loop in functional mode, but will be also broken if it can become a loop during test.

FIG. 13A shows an example set of RTL Verilog codes before and after scan repair of a combinational feedback loop or a potential combinational feedback loop in accordance with the present invention. In order to repair a combinational feedback loop violation or a potential feedback loop violation, a storage element is inserted into the loop. The added storage element will be replaced with a scan cell and will be stitched into scan chains. A test enable signal, TE, is used to fix such a combinational feedback loop violation or a potential feedback loop violation. In the modified RTL Verilog codes, an always block is added to model the inserted D flip-flop on line 10. The continuous assignment on line 14 uses TE to break a combinational feedback loop or a potential combinational feedback loop. When TE has logic value 1, such a combinational feedback loop or potential combinational feedback loop is broken by the inserted D flip-flop.

Figure 13B:
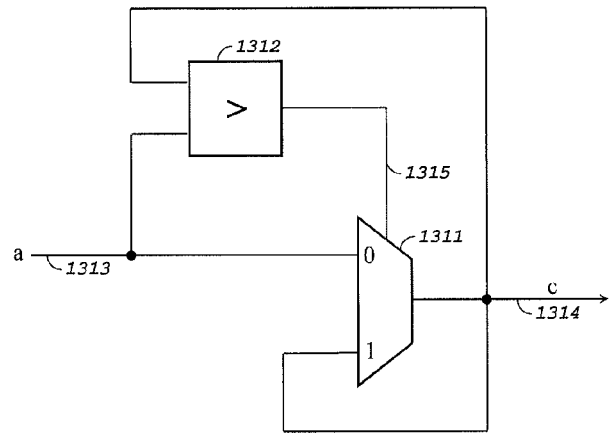

FIG. 13B shows circuit model corresponding to the original RTL codes in FIG. 13A. There are two combinational feedback loops in the circuit model. One combinational feedback loop goes from the output 1314 of the multiplexer 1311 through the output 1315 of the comparator 1312, and reaches back to the output 1314 of the multiplexer 1311. The other combinational feedback loop goes from the output 1314 of the multiplexer 1311 through the multiplexer 1311 itself, and reaches back to the output 1314 of the output of the multiplexer 1314.

Figure 13C:
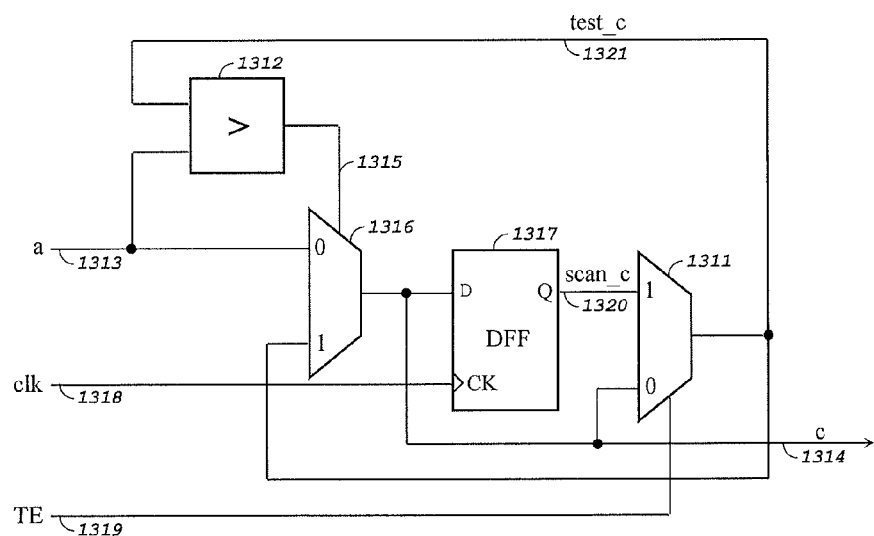

FIG. 13C shows the circuit model after the combinational feedback loops shown in FIG. 13B are broken. One D flip-flop DFF 1317 and one multiplexer 1316 are added to repair the combinational feedback loop violations during test. The combinational feedback loops will be broken by DFF 1317 when the test enable signal TE 1319 is set to logical value 1 during test.

FIG. 14 shows an example set of RTL Verilog codes and circuit models before and after scan repair of a pulse generator violation in accordance with the present invention.

FIG. 14A shows an example set of RTL Verilog codes before and after scan repair of a pulse generator violation in accordance with the present invention. In the original RTL codes, the reset signal g_rst on line 3 comes from a pulse generator on line 1. Such a pulse generator may cause unexpected glitches that have adverse effects on a circuit in a capture cycle during test. A test enable signal TE is used to fix such a pulse generator violation. In the modified RTL Verilog codes, the signal test_g_rst on line 5 is added to model the repaired reset signal. The continuous assignment on line 5 uses TE to disable the reset signal during test.

Figure 14B:
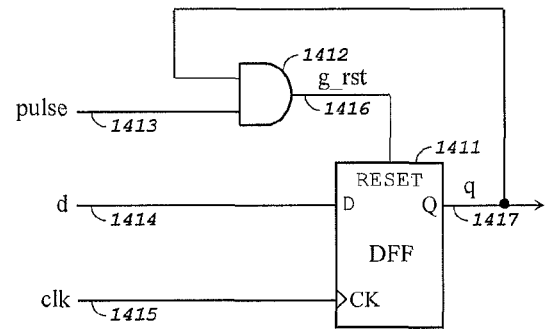

FIG. 14B shows the circuit model corresponding to the original RTL codes shown in FIG. 14A. The output 1417 of D flip-flop DFF 1411 is connected through an AND gate 1412 to its own set/reset signal. The output 1417 of D flip-flop DFF 1411 may generate a short pulse during test, thus invalidating test results.

Figure 14C:
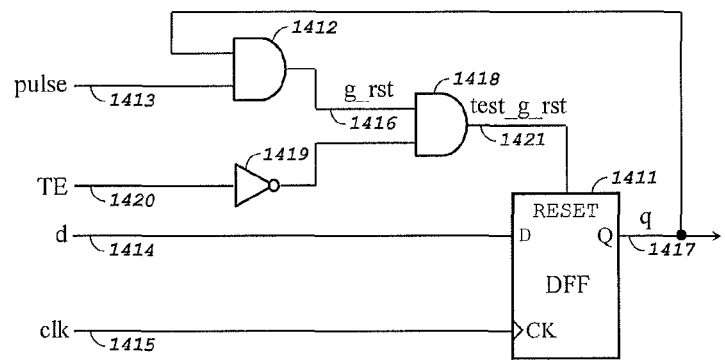

FIG. 14C shows the circuit model after the scan repair of the pulse generator violation shown in FIG. 14B is performed. An AND gate 1418 and an inverter 1419 are added to disable the set/reset signal of the D flip-flop DFF 1411 during test. When the test enable signal TE 1420 is set to logic value 1 during test, the set/reset signal of D flip-flop DFF 1411 is disabled.

FIG. 15 shows an example set of RTL Verilog codes and circuit models before and after scan repair of potential bus contention in accordance with the present invention.

In a shift cycle, any bus must not be driven by more than one driver; otherwise, bus contention will occur. If a bus contention violation is found by testability analysis at RTL, a scan enable signal SE will be used to repair the violation so that only one driver drives the bus in a shift cycle.

FIG. 15A shows an example set of RTL Verilog codes before and after scan repair of potential bus contention in accordance with the present invention. In the original RTL Verilog codes, the enable signals that control the tri-state buffers come from the outputs of D flip-flops. If the D flip-flops are replaced by scan cells, more than one tri-state buffers may be activated in a shift cycle. After scan repair of this bus contention violation as shown in the modified RTL Verilog codes, a scan enable signal SE on lines 7 to 10 is added to enable only one bus driver but disable all others in a shift cycle when SE has logic value 1.

Figure 15B:
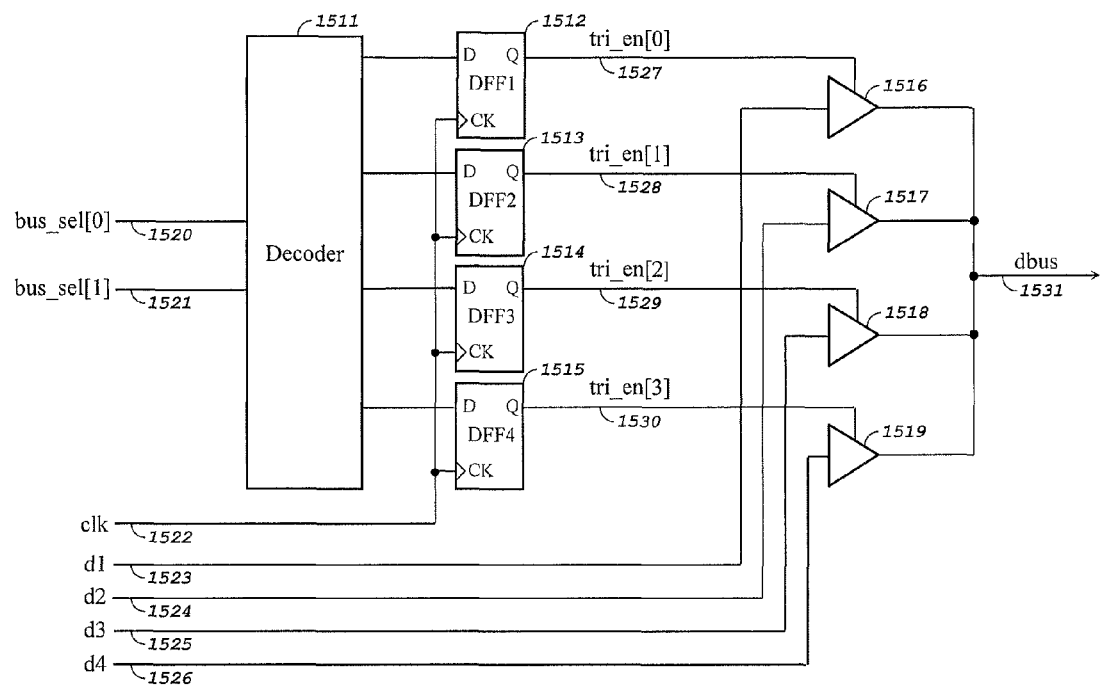

FIG. 15B shows the circuit model corresponding to the original RTL codes shown in FIG. 15A. The circuit will operate correctly in functional mode since the enable signals of the tri-state buffers 1516 to 1519 are fully decoded in functional mode. However, if the D flip-flops DFF1 1512 to DFF4 1515 are replaced with scan cells in a scan-based DFT technique, their outputs, tri_en[0] 1527 to tri_en[3] 1530, may take any combination of logic values. As a result, more than one tri-state buffers may be activated; thus causing a bus contention.

Figure 15C:
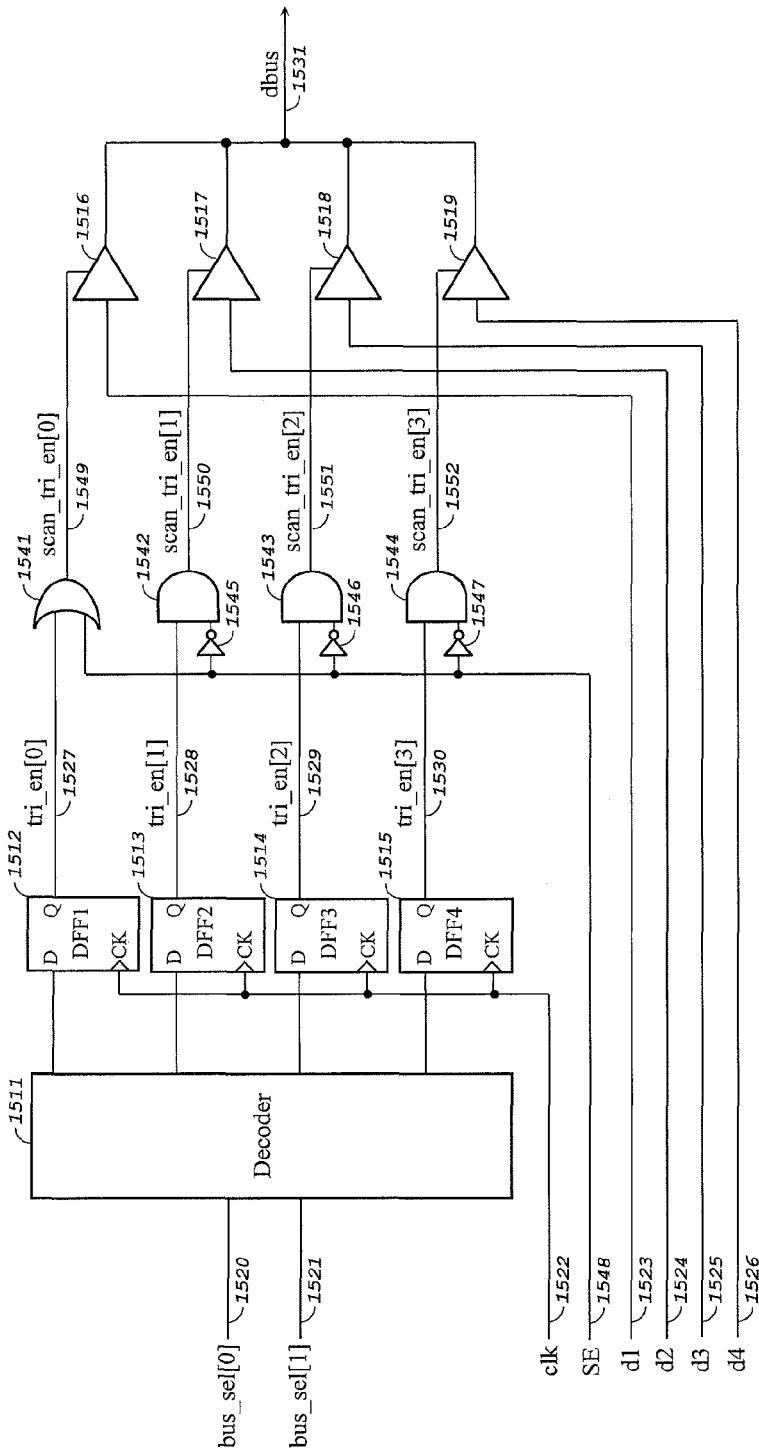

FIG. 15C shows the circuit model after scan repair of the bus contention shown in FIG. 15B is performed. As shown in FIG. 15C, one OR gate 1541, three AND gates 1542 to 1544, and three inverters 1545 to 1547 are added to the original circuit model shown in FIG. 15B in order to repair the bus contention violation. Here, if the scan enable signal SE 1548 is set to logic value 1 in a shift cycle, the repaired tri-state enable signal scan_tri_en[0] 1549 will become logic value 1, activating the tri-state buffer 1516. The other tri-state buffers are disabled since the repaired tri-state enable signals scan_tri_en[1] 1550, scan_tri_en[2] 1551 and scan_tri_en[3] 1552 will become logic value 0 in a shift cycle. As a result, only d1 1523 can drive the bus dbus 1531 in a shift cycle.

FIG. 16 shows an example set of RTL Verilog codes and circuit models before and after control point insertion in accordance with the present invention.

Based on the controllablity measures calculated in RTL testability analysis, control points are inserted to improve the controllablity of a design, resulting in less test cost and higher fault coverage. The user may interactively select a control point or a set of control points and let the system re-compute the estimated fault coverage. After control points are selected, the original RTL Verilog codes are modified to include the control point insertion logic. The types of control points that can be inserted are: OR-control points, AND-control points, MUX-control points, and XOR-control points. Flip-flops that are added for control points will be replaced with scan cells and will be stitched into scan chains during scan replacement and scan stitching. Various control points are modeled with different functions and tasks. Additional always blocks are also required to model added control flip-flops.

FIG. 16A shows an example set of RTL Verilog codes before and after OR-control point insertion and AND-control point insertion in accordance with the present invention. In the modified RTL Verilog codes, the functions on lines 8 and 16 model one 1-bit OR-control point and one AND-control point, respectively. The always block on line 24 models a control D flip-flop. The function call on line 29 models the inserted OR-control point for the signal running. The function call on line 38 models the inserted AND-control point for the signal each8.

FIG. 16B shows an example set of RTL Verilog codes before and after MUX-control point insertion and XOR-control point insertion in accordance with the present invention. In the modified RTL Verilog codes, the functions on lines 8 and 16 model one 1-bit MUX-control point and one XOR-control point, respectively. The always block on line 24 models a control D flip-flop. The function call on line 29 models the inserted MUX-control point for the signal running. The function call on line 38 models the inserted XOR-control point for the signal each8.

Figure 16C:
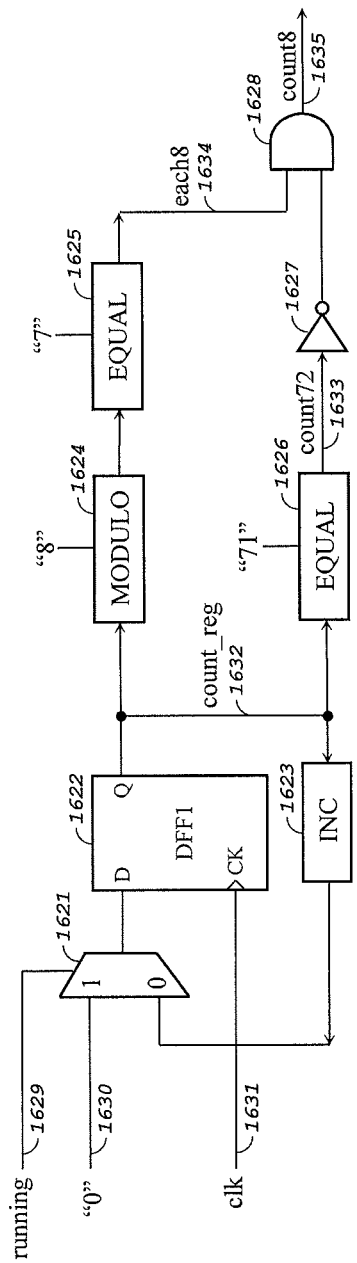

FIG. 16C shows the circuit model corresponding to the original RTL codes shown in FIG. 16A and FIG. 16B. Here, the MODULO unit 1624 and EQUAL units 1625 and 1626 are combinational logic blocks used to implement % (modulo) and == (equal) functions, respectively.

Figure 16D:
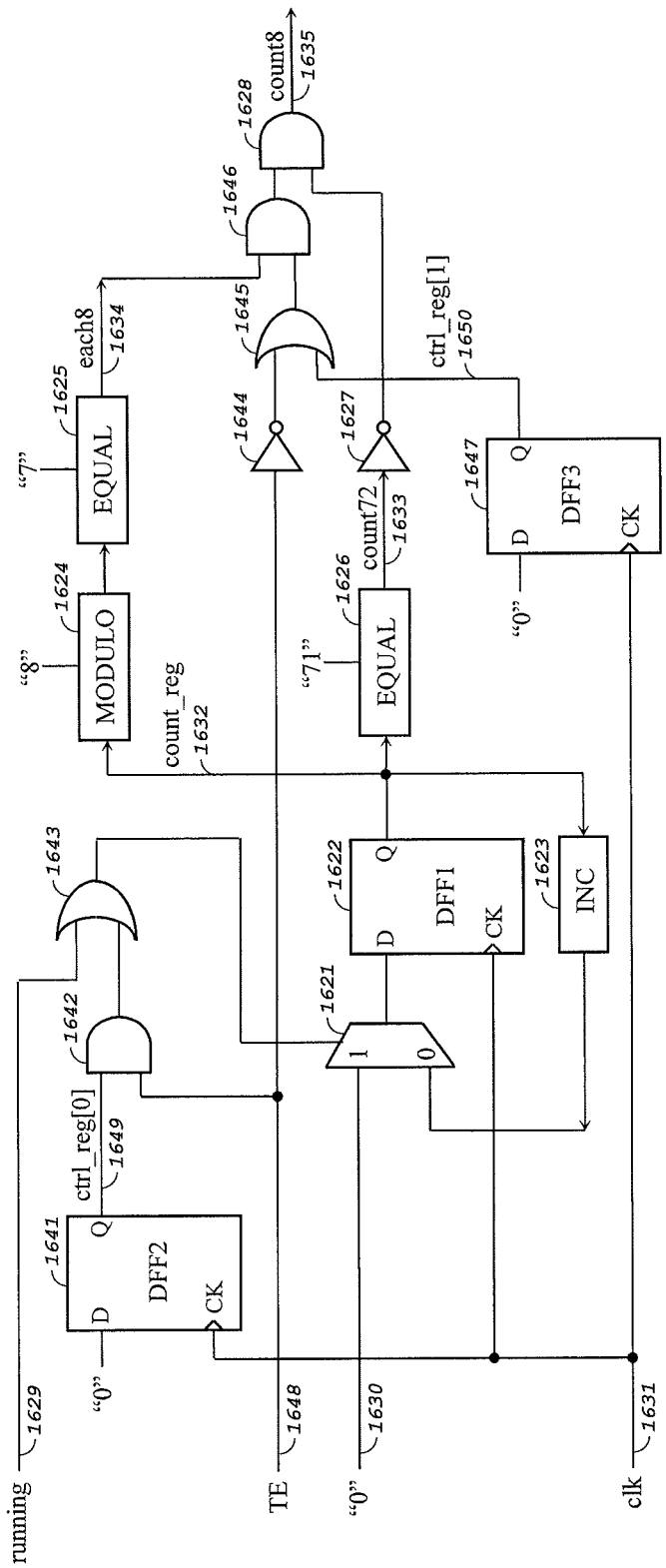

FIG. 16D shows the circuit model after one OR-control and one AND-control points are inserted into the original circuit model shown in FIG. 16C. The OR gate 1643 is inserted for the signal running 1629, while the AND gate 1646 is inserted for the signal each8 1634. The control D flip-flops DFF2 1641 and DFF3 1647 will be replaced with scan cells and will be stitched into scan chains in the scan replacement and scan stitching process. Note that values of ctrl_reg[0] 1649 and ctrl_reg[1] 1650 can be changed easily by shifting values through scan chains, thus improving the controllability of the selection input of the multiplexer 1621 and the input of the AND gate 1628.

Figure 16E:
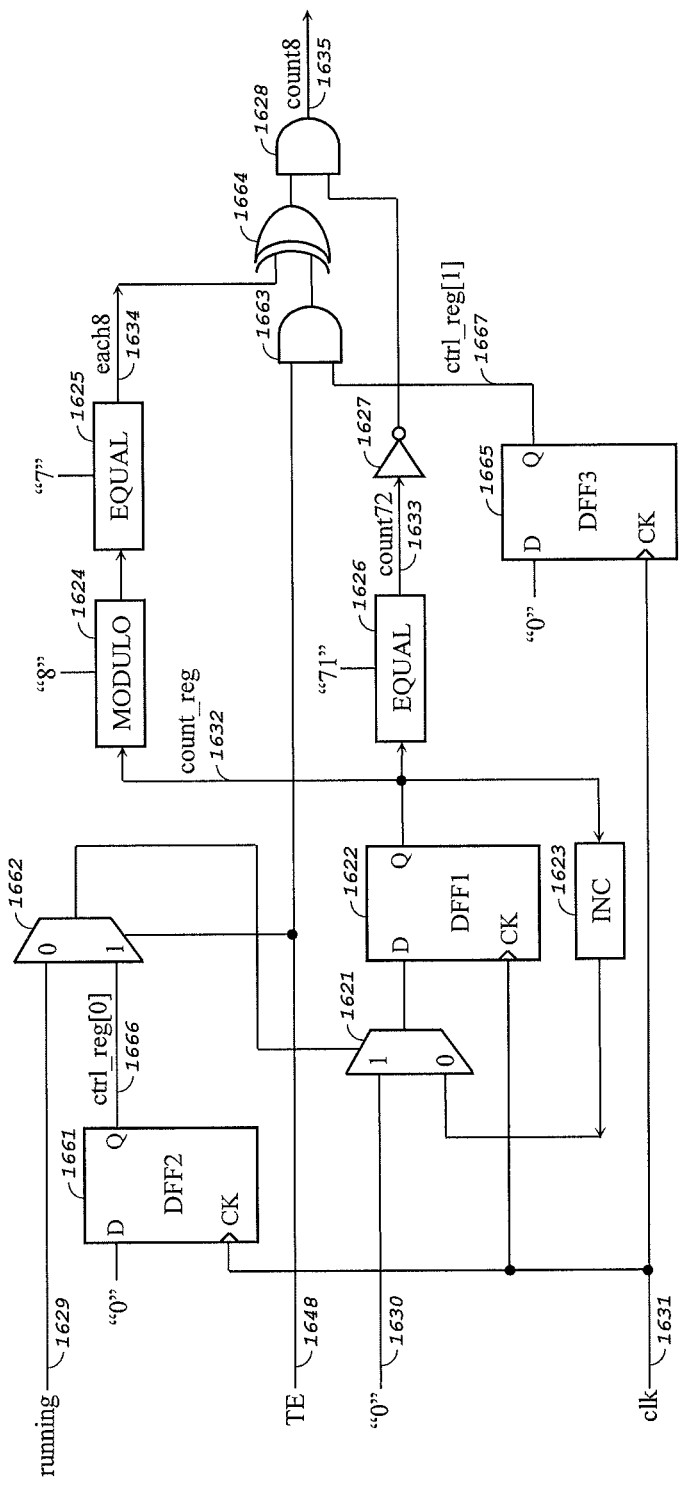

FIG. 16E shows the circuit model after one MUX-control and one XOR-control points are inserted into the original circuit model shown in FIG. 16C. The MUX-control point 1662 is inserted for the signal running 1629, and the XOR-control point 1664 is inserted for the signal each8 1634. The control D flip-flops DFF2 1661 and DFF3 1665 will be replaced with scan cells and will be stitched into scan chains in the scan replacement and scan stitching process. Note that values of ctrl_reg[0] 1666 and ctrl_reg[1] 1667 can be changed easily by shifting values through scan chains, thus improving the controllability of the selection input of the multiplexer 1621 and the input of the AND gate 1628.

FIG. 17 shows an example set of RTL Verilog codes and circuit models before and after observation point insertion in accordance with the present invention.

Based on the observability measures calculated in RTL testability analysis, observation points are inserted to improve the observability of a design, resulting in less test cost and higher fault coverage. The user may interactively select an observation point or a set of observation points and let the system re-compute the estimated fault coverage. After observation points are selected, the original RTL Verilog codes are modified to include the observation point insertion logic. The types of observation points that can be inserted are: normal observation points using flip-flops, shared XOR-observation points, and control-observation points called scan points. Flip-flops that are added for observation points will be replaced with scan cells and will be stitched into scan chains during scan replacement and scan stitching. Various observation and scan points are modeled with different functions and tasks. Additional always blocks are also required to model added observation flip-flops.

FIG. 17A shows an example set of RTL Verilog codes before and after normal observation point insertion in accordance with the present invention. In the modified RTL Verilog codes, two flip-flops are added as observation points for two signals, running and each8, respectively. The task on line 6 models one 1-bit observation point. The two task enable statements on lines 15 and 16 are used to model the added observation points. The observation flip-flops are inferred from the always statement on line 20.

FIG. 17B shows an example set of RTL Verilog codes before and after XOR-observation point insertion in accordance with the present invention. In the modified RTL Verilog codes, two signals, running and each8, are XOR-ed together and connected to the primary output d_out on line 19.

FIG. 17C shows an example set of RTL Verilog codes before and after XOR-observation point insertion and scan point insertion in accordance with the present invention. In the modified RTL Verilog codes, two signals, running and each8, are XOR-ed together to share one observation D flip-flop on lines 32. In addition, a scan point is added to the expression ~count72 on line 46. The always statement on line 29 models the D flip-flops for the observation point and the scan point.

The circuit model corresponding to the original RTL codes of FIG. 17A, FIG. 17B, and FIG. 17C is the same as the one shown in FIG. 16C.

Figure 17D:
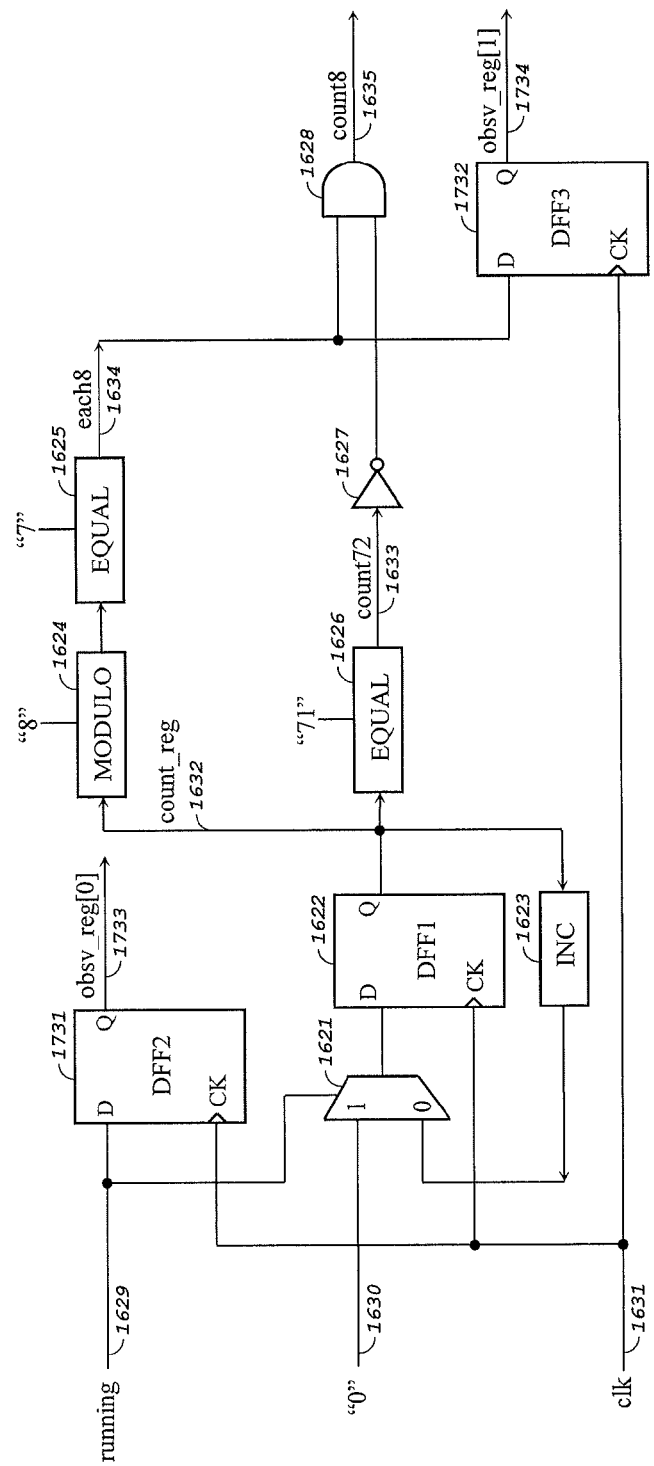

FIG. 17D shows the circuit model after normal observation points are inserted into the original circuit model shown in FIG. 16C. The D flip-flop DFF2 1731 is inserted for the signal running 1629, while the D flip-flop DFF3 1732 is inserted for the signal each8 1634. DFF2 1731 and DFF3 1732 will be replaced with scan cells and will be stitched into scan chains in the scan replacement and scan stitching process. As a result, the values of running 1629 and each8 1634 can be observed through obsv_reg[0] 1733 and obsv_reg[1] 1734.

Figure 17E:
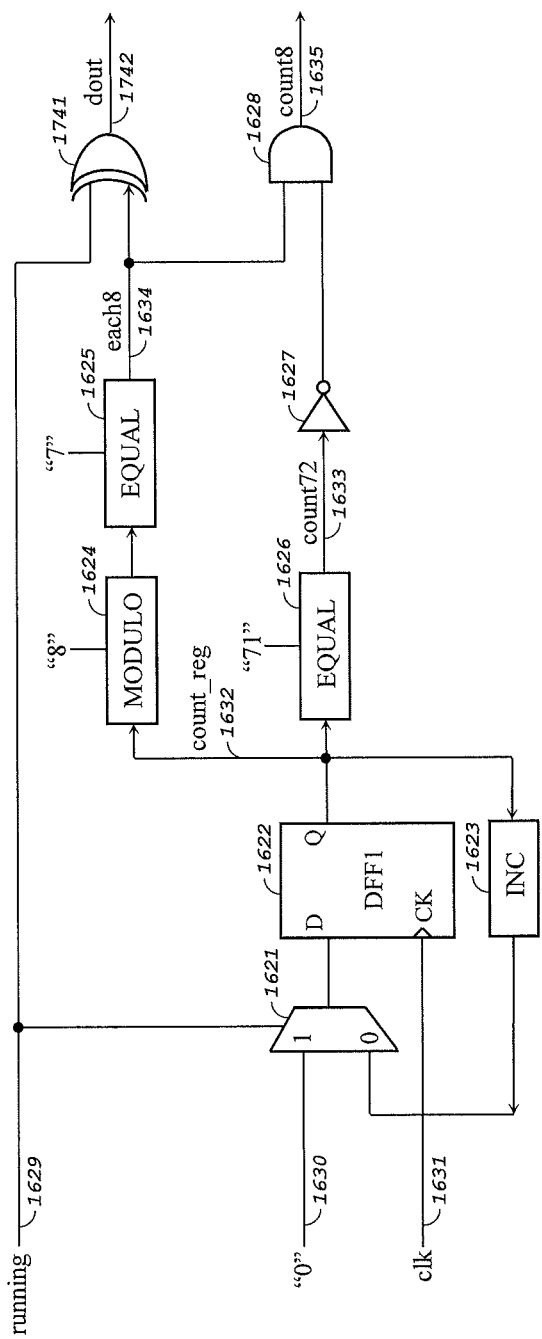

FIG. 17E shows the circuit model after one XOR-observation point is inserted into the original circuit model shown in FIG. 16C. In FIG. 17E, instead of connecting the two signals, running 1629 and each8 1634, to observation D flip-flops, they are connected to an XOR gate 1741, whose output is then connected to primary output dout 1742. As a result, the two signals, running 1629 and each8 1634, can be observed easily through primary output dout 1742.

Figure 17F:
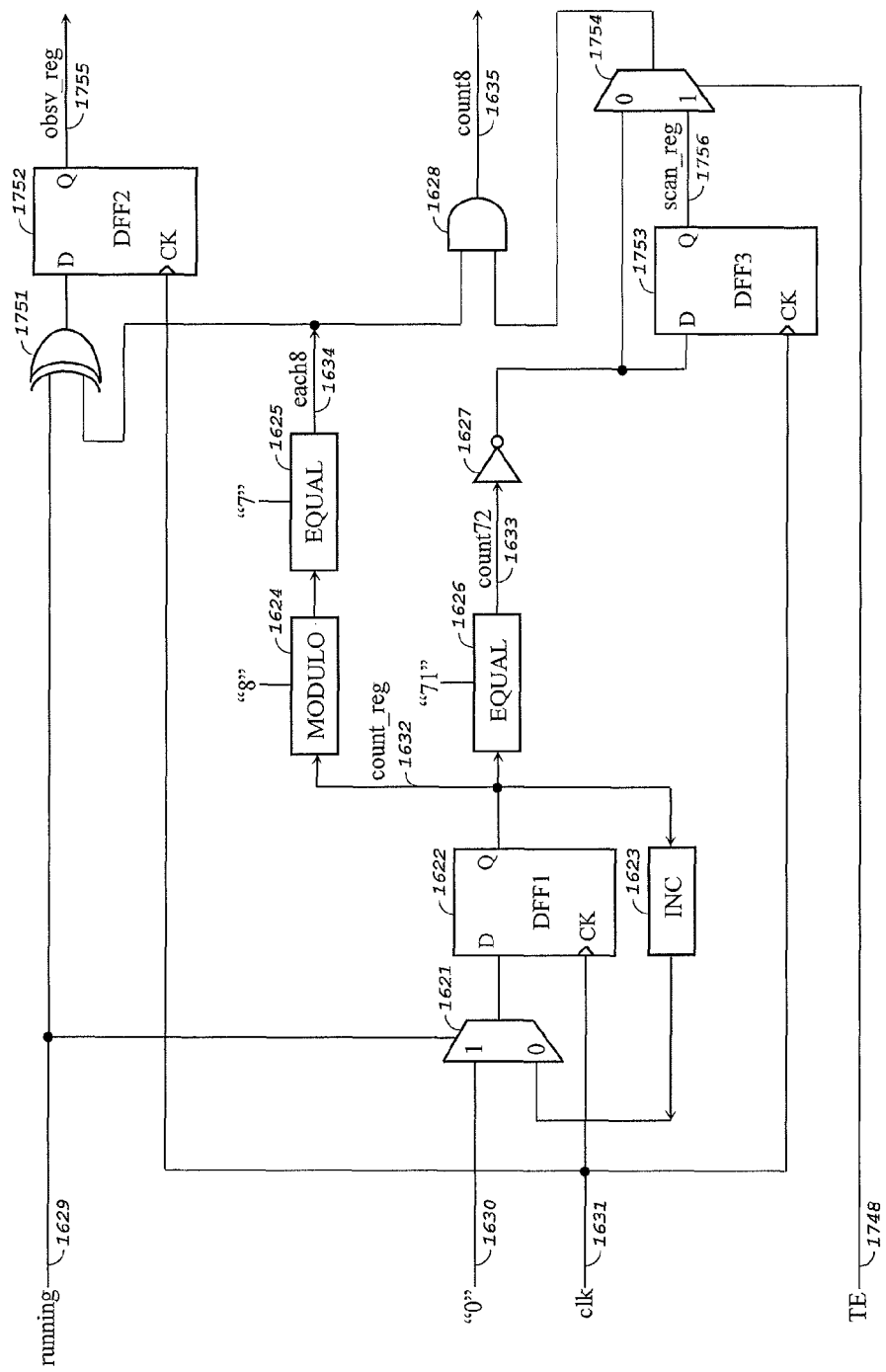

FIG. 17F shows the circuit model after one XOR-observation point and one scan point are inserted into the original circuit model shown in FIG. 16C. In FIG. 17F, two signals, running 1629 and each8 1634, are merged by an XOR gate 1751 whose output is connected to an observation D flip-flop DFF2 1752. In addition, a D flip-flop DFF3 1753 and a multiplexer 1754 are added at the output of the inverter 1627. The D flip-flops DFF2 1752 and DFF3 1753 will be replaced with scan cells and will be stitched into scan chains in the scan replacement and scan stitching process. As a result, the values of running 1629 and each8 1634 can be observed through obsv_reg 1755. In addition, the observability of the output of the inverter 1627 and the controllability of the input of the AND gate 1628 can be improved by the scan point through scan_reg 1756.

FIG. 18 shows an example set of RTL Verilog codes before and after scan replacement and scan stitching in accordance with the present invention. In the original RTL codes, two D flip-flops are inferred by the always statement on line 9. In the modified RTL codes, scan replacement and scan stitching take place in the always statement on line 11. A scan enable signal, SE, a scan input signal, SI, and a scan output signal, SO, are added. In the modified RTL codes, the output of the first D flip-flop is automatically connected to the scan data input of the second D flip-flop during scan stitching as shown on lines 19 to 22.

FIG. 19 shows an example set of commands for scan extraction at RTL in accordance with the present invention. Two commands are provided: set_port on line 1 and extract on line 8. The set_port command is used to indicate which scan in and out ports should be used for scan extraction. The extract command performs scan extraction by using both simulation and topological searches to extract a scan chain with the specified scan in port and scan out port. The scan instances found during the process are stored in a specified file. If the process fails to extract an intact scan chain from the specified scan in port and scan out port, the longest path will be listed in the specified file, and an error message will be issued.

FIG. 20 shows an example set of commands for interactive scan debug at RTL in accordance with the present invention. During interactive scan debug, the designer will be able to trace and locate broken scan chains and provide temporary fixes until all errors are found. The present invention consists of 5 scan debug commands: force, force_clock, trace_fanin, trace_fanout, and flush_test, on lines 1, 4, 7, 10, and 13, respectively. The interactive scan debug process typically starts with specifying the input pattern that will be shifted in during flush test. A default pattern will be used if no input pattern is specified. The scan enable signal SE is set to enable the shift operation of the scan chain. The scan clock of the scan chain is set to activate the shift operation. The flush_test command performs simulation to shift in the pattern and checks if the scan chain is broken or some scan cells are transparent. If the scan chain is broken, the commands force, trace_fanin, and trace_fanout can be used to interactively force a certain value to a net in order to identify the cause of the broken scan chain.

FIG. 21 shows an example set of commands for interactive scan repair at RTL in accordance with the present invention. In interactive scan repair mode, the program will list each design rule violation and will provide a suggestion to fix it. The designer can either accept (A) the suggestion with recommended RTL codes to fix the rule violation automatically, or skip (S) the suggestion to modify original RTL codes later manually.

FIG. 22 shows 3 example syntaxes of input information for generating HDL (hardware description language) test benches and ATE (automatic test equipment) test programs. The input information mainly includes tester-specific timing diagrams specified in the ASCII format. In FIG. 22, a non-overlapping mode is shown. It can be seen that the ATE cycle time is set to 100 ns, the SCK1 clock rises at 20 ns and falls at 30 ns, the SCK2 clock rises at 40 ns and falls at 50 ns, the SCK3 clock rises at 60 ns and falls at 70 ns, and the SCK4 clock rises at 80 ns and falls at 90 ns. Additional information, such as primary output strobe timing, is also specified in FIG. 22. Based on such information, HDL test benches and ATE test programs can be generated. FIG. 22 also shows information for overlapping mode and one-hot mode, respectively.

Figure 23:
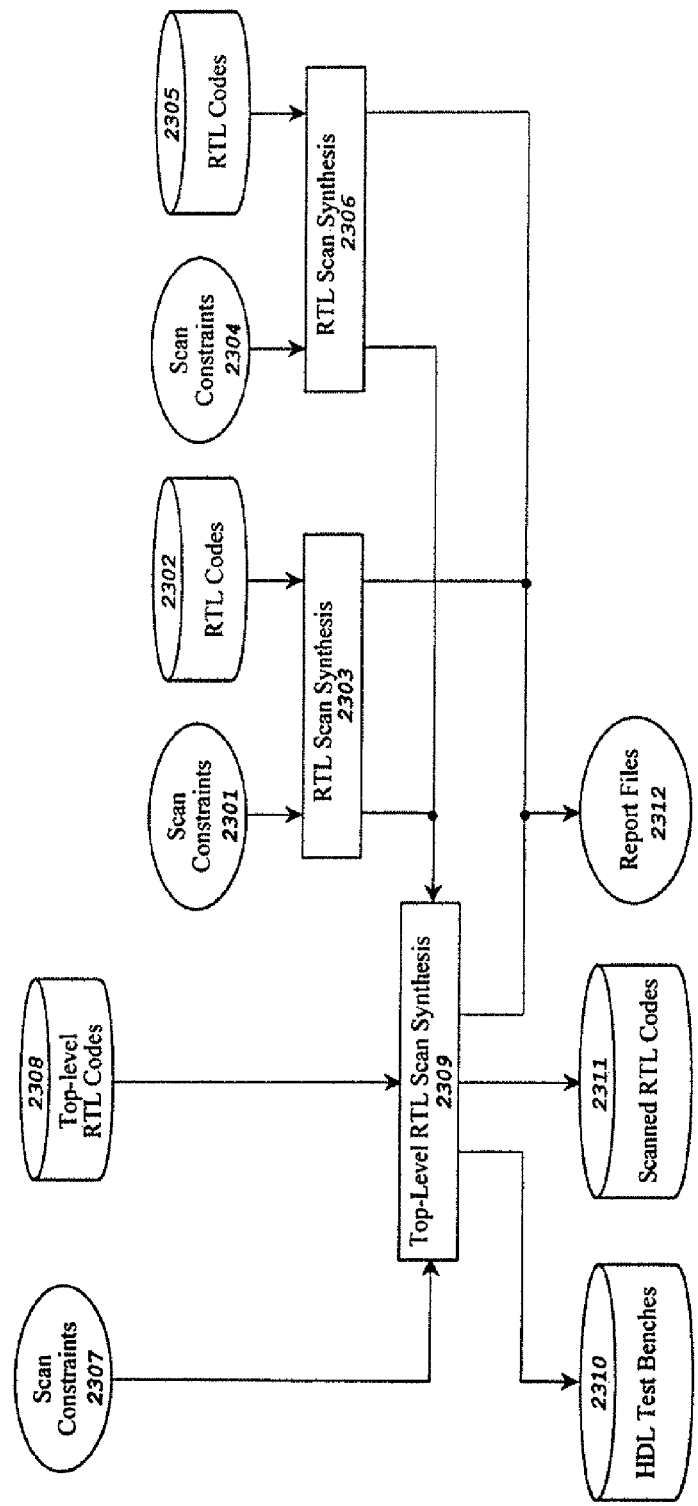
FIG. 23 shows a flow diagram of a computer-aided design (CAD) system for hierarchical scan synthesis at RTL in accordance with the present invention.

FIG. 23 shows a flow diagram of a computer-aided design (CAD) system for hierarchical scan synthesis at RTL in accordance with the present invention.

Assume that an integrated circuit modeled at RTL consists of one top-level module and 2 independent modules. The CAD system 2300 for hierarchical RTL scan synthesis accepts user-supplied RTL codes for the top-level module 2308, and the 2 independent modules 2302 and 2305. The CAD system 2300 also accepts top-level scan constraints 2307 and 2 sets of module-level scan constraints 2301 and 2304. The scan constraints are needed for RTL scan synthesis on a module-by-module basis.

Module-level scan constraints, 2301 and 2304, contain all set-up information and scripts required to perform corresponding module-level RTL scan synthesis, 2303 and 2306, respectively. The top-level scan constraints 2307 contain all set-up information and scripts required to perform top-level RTL scan synthesis 2309. The CAD system will then produce final scanned RTL codes 2311 as well as HDL (hardware description language) test benches 2310. All reports and errors are stored in the report files 2312.

Part of example information needed for this hierarchical scan synthesis at RTL, described in the ASCII format, is shown as follows:

```
%SCAN_SYNTHESIS_MODULES
{
    %MODULE module_1
    {
        %SCAN_IN = scan_in_of_module_1;      // Scan in ports
        %SCAN_OUT = scan_out_of_module_1;    // Scan out ports
        %SCAN_ENABLE = SE_1;                 // Scan enable signal of module_1
        %TEST_ENABLE = TE_1;                 // Test enable signal of module_1
        %DFT = module_dft_1;                 // Scan constraints file of module_1
    }
    %MODULE module_2
    {
        %SCAN_IN = scan_in_of_module_2;      // Scan in ports
        %SCAN_OUT = scan_out_of_module_2;    // Scan out ports
        %SCAN_ENABLE = SE_2;                 // Scan enable signal of module_2
        %TEST_ENABLE = TE_2;                 // Test enable signal of module_2
        %DFT = module_dft_2;                 // Scan constraints file of module_2
    }
}
```

Figure 24:
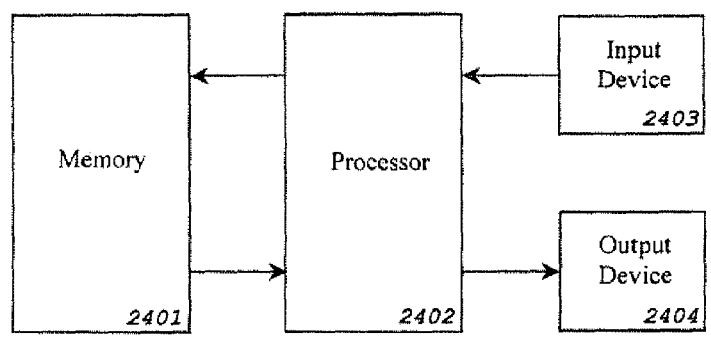
FIG. 24 shows an example system in which a computer-aided design (CAD) system for RTL scan synthesis, in accordance with the present invention, may be implemented.

FIG. 24 shows an example system in which a computer-aided design (CAD) system for RTL scan synthesis, in accordance with the present invention, may be implemented. The system 2400 includes a processor 2402, which operates together with a memory 2401 to run a set of the RTL scan synthesis software. The processor 2402 may represent a central processing unit of a personal computer, workstation, mainframe computer, or other suitable digital processing device. The memory 2401 can be an electronic memory or a magnetic or optical disk-based memory, or various combinations thereof. A designer interacts with the RTL scan synthesis software run by processor 2402 to provide appropriate inputs via an input device 2403, which may be a keyboard, disk drive, or other suitable source of design information. The processor 2402 provides outputs to the designer via an output device 2404, which may be a display, a printer, a disk drive, or various combinations of these and other elements.

Figure 25:
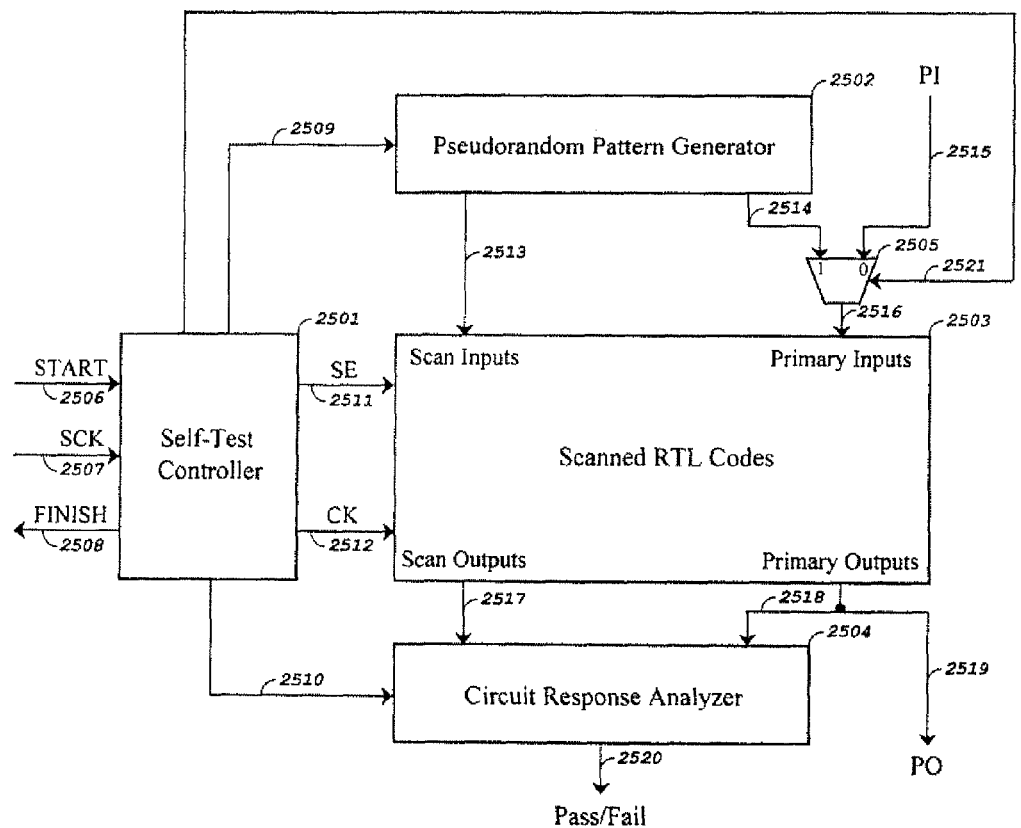
FIG. 25 shows an example self-test environment for testing a scanned RTL design generated by scan synthesis at RTL in accordance with the present invention.

FIG. 25 shows an environment in which a scanned RTL design developed using the process of FIG. 2 or FIG. 23 may be tested. The environment 2500 is generally referred to as a self-test environment. The scanned RTL random logic circuit described by scanned RTL codes 2503 is interconnected with self-test logic in a self-test environment. The self-test logic includes a self-test controller 2501, a pseudorandom pattern generator 2502, a circuit response analyzer 2504, and a multiplexer 2505. The pseudorandom pattern generator 2502 generates random patterns that are applied to the scan inputs 2513 and primary inputs 2516 during test. The multiplexer 2505 is controlled in such a manner that primary inputs 2516 get input values from the pseudorandom pattern generator 2502 in self-test mode. The circuit response analyzer 2504 compresses the scan outputs 2517, and optionally the primary outputs 2518, at each clock cycle and results in a signature at the end of self-test session. Then, the signature is compared with an expected signature to determine if there is a mismatch between them. The comparison can be conducted either on-chip or by an automatic test equipment (ATE) after the signature is shifted out. If the comparison is conducted on-chip, the result can be indicated by the Pass/Fail signal 2520. The self-test controller 2501 starts a self-test session in response to the START signal 2506, and sets the FINISH signal 2508 at the end of the self-test session. The self-test controller 2501 also generates all control signals including scan enable SE signals 2511. In addition, the self-test controller 2501 manipulates and controls self-test clocks CK 2512 based on original scan clocks SCK 2507.

Figure 26:
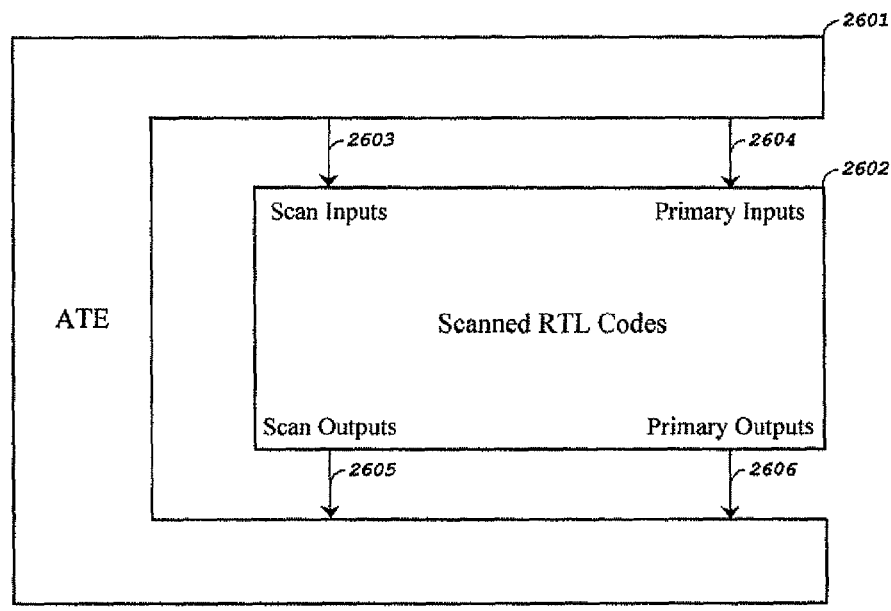
FIG. 26 shows an example scan-test environment for testing a scanned RTL design generated by scan synthesis at RTL in accordance with the present invention.

FIG. 26 shows an environment in which a scanned RTL design developed using the process of FIG. 2 or FIG. 23 may be tested. The environment 2600 is generally referred to as a scan-test environment. The scanned RTL random logic circuit described by scanned RTL codes 2602 is interconnected with a set of automatic test equipment (ATE) 2601. The ATE 2601 is capable of applying a predetermined set of test vectors to the scan inputs 2603 and the primary inputs 2604 of the scanned RTL random logic circuit, and observing the scan outputs 2605 and the primary outputs 2606 to determine if there is a mismatch between observed and expected results at any clock cycle. The test vectors may be generated using an automatic test pattern generation (ATPG) program, which generates appropriate test vectors based on, for example, a gate-level netlist and a description of the scan chains.

Having thus described presently preferred embodiments of the present invention, it can now be appreciated that the objectives of the invention have been fully achieved. And it will be understood by those skilled in the art that many changes in construction & circuitry, and widely differing embodiments & applications of the invention will suggest themselves without departing from the spirit and scope of the present invention. The disclosures and the description herein are intended to be illustrative and are not in any sense limitation of the invention, more preferably defined in scope by the following claims.

We claim:

1. A method of performing scan extraction for extracting scan cells from a plurality of scan chains in a scan-based integrated circuit modeled at RTL (register-transfer level), the integrated circuit having a plurality of clock domains and each domain having one scan clock; said method comprising computer-implemented steps of:

(a) using a computer to compile scan-based HDL (hardware description language) code that represents said integrated circuit at RTL into a design database stored in a memory;

(b) receiving scan constraints from an external source through an input device, said scan constraints further comprising a scan in port and a scan out port for each said scan chain; and (c) using said computer to extract said scan cells from each said scan chain according to said scan in port and said scan out port specified in said scan constraints.

2. The method of claim 1, wherein said extracting said scan cells from each said scan chain further comprises computer-implemented steps of:

(d) setting selected scan enable (SE) signals to predetermined logic values to enable shifting of said scan chain;

(e) performing topological search, simulation, or a combination of both to generate an ordered list of said scan cells from each said scan chain; and (f) reporting broken scan cells within each said broken scan chain where scan extraction fails.

* * * * *